US010665745B2

(12) United States Patent
Marshall

(10) Patent No.: US 10,665,745 B2
(45) Date of Patent: May 26, 2020

(54) MAGNETICALLY POLARIZED PHOTONIC DEVICE

(71) Applicant: TAE TECHNOLOGIES, INC., Foothill Ranch, CA (US)

(72) Inventor: Daniel Scott Marshall, Chandler, AZ (US)

(73) Assignee: TAE TECHNOLOGIES, INC., Foothill Ranch, CA (US)

( * ) Notice: Subject to any disclaimer, the term of this patent is extended or adjusted under 35 U.S.C. 154(b) by 76 days.

(21) Appl. No.: 14/105,828

(22) Filed: Dec. 13, 2013

(65) Prior Publication Data

US 2014/0166086 A1      Jun. 19, 2014

Related U.S. Application Data

(60) Provisional application No. 61/737,073, filed on Dec. 13, 2012.

(51) Int. Cl.
*H01L 31/065* (2012.01)
*H01L 31/09* (2006.01)
(Continued)

(52) U.S. Cl.
CPC ........ *H01L 31/065* (2013.01); *H01L 31/0296* (2013.01); *H01L 31/02966* (2013.01);
(Continued)

(58) Field of Classification Search
CPC . H01L 31/02167; H01L 31/065; H01L 31/09; H01L 31/02966; H01L 31/0296; H01L 31/049; H01L 43/00; H01L 27/22; H01L 29/82; H01L 31/1832; H01L 31/18; H01L 2924/1032; H01L 33/002; H01L 21/0251; H01L 21/02277; H01L 21/02274; H01L 21/0228; Y02E 10/50;
(Continued)

(56) References Cited

U.S. PATENT DOCUMENTS 3,322,575 A    5/1967   Ruehrwein
3,496,024 A    2/1970   Ruehrwein
(Continued)

FOREIGN PATENT DOCUMENTS

JP          61-13673 B2    4/2017

OTHER PUBLICATIONS

De Mey, G., "Theoretical analysis of the Hall effect photovoltaic cell", Laboratory of Electronics, University of Ghent, Belgium, 1979, pp. 1-9.
(Continued)

*Primary Examiner* — Michael Y Sun
(74) *Attorney, Agent, or Firm* — One LLP

(57) ABSTRACT

A magnetically polarized photonic device is provided. The magnetically polarized photonic device (100) includes substrate (102), an annihilation layer (106) and a graded band gap layer (142). The annihilation layer (106) is deposed on a surface (104) of substrate (102) with graded band gap layer (142) disposed on annihilation layer (106). Contacts (116, 128) are disposed on ends (146, 150) of magnetically polarized photonic device (100). A magnetic field (159) is applied to graded band gap layer (142) and annihilation layer (106) to drive charges to contacts (116, 128).

38 Claims, 8 Drawing Sheets

(51) Int. Cl.
*H01L 31/0296* (2006.01)
*H01L 21/02* (2006.01)
*H01L 33/00* (2010.01)
*H01L 31/18* (2006.01)
*H01L 29/82* (2006.01)
*H01L 27/22* (2006.01)
*H01L 43/00* (2006.01)

(52) U.S. Cl.
CPC .......... *H01L 31/09* (2013.01); *H01L 21/0228* (2013.01); *H01L 21/0251* (2013.01); *H01L 21/02274* (2013.01); *H01L 21/02277* (2013.01); *H01L 27/22* (2013.01); *H01L 29/82* (2013.01); *H01L 31/18* (2013.01); *H01L 31/1832* (2013.01); *H01L 33/002* (2013.01); *H01L 43/00* (2013.01); *H01L 2924/1032* (2013.01); *Y02E 10/50* (2013.01); *Y02E 10/543* (2013.01); *Y02E 10/545* (2013.01); *Y02E 10/546* (2013.01); *Y02E 10/547* (2013.01); *Y02E 10/548* (2013.01)

(58) Field of Classification Search
CPC ... Y02E 10/548; Y02E 10/547; Y02E 10/546; Y02E 10/543; Y02E 10/545
See application file for complete search history.

(56) References Cited

U.S. PATENT DOCUMENTS

| | | |
|---|---|---|
| 4,547,621 A | 10/1985 | Hack et al. |
| 5,051,804 A | 9/1991 | Morse et al. |
| 7,109,409 B2 | 9/2006 | Chu |
| 7,119,091 B2 | 10/2006 | Habashita et al. |
| 2007/0028958 A1* | 2/2007 | Retti ................ B60L 5/005 136/244 |
| 2008/0245409 A1* | 10/2008 | Varghese .......... H01L 31/06875 136/256 |
| 2009/0320897 A1* | 12/2009 | Shimomura ............ H01L 31/05 136/244 |
| 2010/0083999 A1 | 4/2010 | Hovel |
| 2010/0096003 A1* | 4/2010 | Hobbie ............ H01L 31/02167 136/254 |
| 2010/0186798 A1* | 7/2010 | Tormen ............... H01L 31/0547 136/246 |
| 2011/0023958 A1 | 2/2011 | Masson et al. |
| 2011/0287578 A1* | 11/2011 | Wojtczuk ............ H01L 31/0684 438/94 |
| 2012/0315383 A1* | 12/2012 | Bright ..................... G06F 3/044 427/108 |

OTHER PUBLICATIONS

WO, PCT/US2013/075003 ISR, dated Jul. 3, 2014.
WO, PCT/US2013/075003 IPRP, dated Jun. 16, 2015.
AU, 2013359049 Examination Report #1, dated Nov. 30, 2016.
AU, 2013359049 Examination Report #2, dated Sep. 22, 2017.
CN, 201380072909.1 First Office Action, dated Jul. 5, 2016.
EP, 13861872.3 Supplementary Search Report, dated Jul. 12, 2016.
EA, 201591120 Office Action, dated Jan. 27, 2017.
EA, 201591120 Office Action, dated Jul. 31, 2017.
EA, 201591120 Office Action, dated Mar. 21, 2018.
Rebane, Y.T., et al., "Two new types of graded-band-gap solar cells", Semiconductors, 1993, vol. 27, pp. 1058-1061.
JP, 2015-547986 Official Action, dated Nov. 14, 2017.

* cited by examiner

MAGNETICALLY POLARIZED PHOTONIC DEVICE

FIELD OF INVENTION

The present invention generally relates to energy production, photonic sensing, and magnetically polarized photonic devices; and more particularly, to magnetically polarized photonic devices, and methods for making same.

BACKGROUND

Over the past few years, there has been an increase in interest in renewable and sustainable energy resources which has spurred research and development in many energy resources. In particular, substantial research and development has centered around photovoltaic energy and its generation. Generally, conventional photovoltaic cells where first developed in 1958 by Bell Laboratories where a diffused silicon p-n junction was used. While the efficiencies of these conventional diffused silicon p-n junction devices improved over the decades, the best conventional diffused silicon p-n junction devices have not exceeded twenty-three percent (23%). While certainly there was improvement of the efficiency of these conventional diffused silicon p-n junction devices over the years, it has become apparent that there are fundamental limitations to the efficiency that can be achieved by diffused silicon p-n junction devices. Also, the cost of silicon wafers used for making conventional photovoltaic cells has remained high making the cost of conventional photovoltaic cells non-competitive when compared to alternative technologies.

The introduction of conventional multi-junction photovoltaic devices around 1976, showed significantly better efficiencies which improved over the decades and have achieved efficiencies ranging up to and about forty-three (43.0 percent). While this is significantly better then the conventional diffused silicon p-n junction devices, the multi-junction photovoltaic devices are still not efficient enough for some applications. More importantly, since the efficiencies of both the conventional diffused silicon p-n junction devices and the conventional multi-junction photovoltaic devices have reached a plateau for at least the last decade and for the foreseeable future. There is very little reason to believe that significantly greater efficiency can be wrung out of the conventional devices.

Both the conventional diffused silicon p-n junction devices and the multi-junction photovoltaic devices share some common problems. While in some cases each type of device has some particular problems of its own. One problem or disadvantage is that both types of conventional devices are built as discrete devices. For example, a conventional diffused silicon p-n junction device that is built having a band gap of 1.1 eV will efficiently capture light having 1.1 eV energy. Any energy of light below the 1.1 eV energy band gap is not captured. Also, any energy of light above the 1.1 eV energy band gap is wasted and not put to productive use. More specifically, a 1.1 eV band gap photovoltaic cell that absorbs a 1.2 eV photon will efficiently convert 1.1 eV of the 1.2 eV photon energy and will waste the 0.1 eV difference. Similarly, the 1.1 eV band gap photovoltaic cell that absorbs a 2.2 eV photon will efficiently convert 1.1 eV of the 2.2 eV photon energy and waste the additional 1.1 eV of photon energy. This same principle is true of any single junction device of a given energy band gap. In addition to this effect, silicon is well-known as an Indirect Band Gap material as opposed to III/V materials that are generally, but not exclusively, Direct Band Gap materials. Photovoltaic devices made with indirect band gap materials further waste energy due to their inability to completely absorb photons with energy equal to and just above their material band gap.

Conventional multiple junction devices are also discrete devices; however, because conventional multiple junction devices are typically built using III/V materials and germanium substrates, multiple junctions devices can be stacked vertically on top of each other, thereby enabling a vertical stack of energy band gaps that using a silicon substrate does not allow. However, as stated before, if the band gap of the junction is engineered and built to capture 1.1 eV energy photons, the junction will efficiently capture the 1.1 eV energy photons but, will not capture lower other energy photons and will waste the photon energy above 1.1 eV. In order to efficiently capture other energy photons, other band gap junctions are built and stacked on the substrate. Typically, these other junctions are tuned for a 1.5 eV energy band gap, a 1.2 eV energy band gap, and a 0.8 eV energy band gap, thereby giving a triple junction device that is capable of capturing photons having greater than 1.5 eV in the 1.5 eV device, and capturing photons having energy between 1.2 eV and 1.5 eV in the 1.2 eV device, and capturing photons having energy between 0.8 eV and 1.2 eV in the 0.8 eV device. However, photons having energy levels of less than 0.8 eV are not captured at all and are wasted and not used. Also, as described earlier, the additional energy of each photon above the energy band gap of the junction in which it is absorbed is also wasted. As an example, a 1.4 eV photon that is absorbed in the 1.2 eV band gap junction loses 0.2 eV of its energy immediately as waste, and only the remaining 1.2 eV of energy is converted efficiently. Another weakness specific to the multiple junction devices is the requirement that current in the device travel in the reverse direction to conventional diode current flow at the transitions between adjacent stacked junctions. This is accomplished by doping the semiconductor material in these transition regions with extremely high concentrations of n-type and p-type elements so that the diode structure becomes a Tunnel diode capable of carrying current in the reverse direction. These tunnel diodes are not perfect conductors of electricity and introduce a loss mechanism specific to multiple junction devices.

Thus, it can be seen that both the conventional diffused silicon p-n junction type of devices and the multi-junction photovoltaic type of devices have fundamental problems in design since they have inherent problems in their basic design it is not possible to capture and convert all the photons that fall on them into free electrons and free holes. Essentially, there are inherent inefficiency problems which stem from the materials that are used to make the devices and the way these devices are engineered and designed.

Both types of photovoltaic devices, the conventional multi-junction photovoltaic cells and the conventional diffused silicon p-n junction type of devices, are more efficient when a concentrated number of photons or an increase in intensity of photons are delivered to the receiving surface of either device type. However, this is also a problem because concentration of photons requires engineering an infrastructure that concentrates photons onto the devices themselves. This infrastructure requires engineering, materials, design, and precision. All of which increases the complexity and the cost of making and implementing photovoltaic devices into the market. Moreover, another problem is that when the photons are obscured, such as with cloud cover or shade, the efficiency is severely diminished if not stopped all together.

Another problem with multi-junction devices is that it is not possible to put an endless number of junctions in the device so as to increase the opportunity to capture and convert photons into useable free electrons and free holes. Moreover, it is not possible to make the photovoltaic device arbitrarily thick. The thickness of the photovoltaic device outside the actual junction has to be approximately one diffusion length, wherein the diffusion length is the approximate length of a path that a charge carrier can travel in a volume of a crystal lattice without an electric field before the charge carrier has a recombination event. The diffusion length generally depends upon the semiconductor material used, the doping of the semiconductor material, and the perfection of the semiconductor material. Generally, there is no totally optimal set condition for all the factors. The conditions are selected on a case by case basis for the particular application. However, it is fair to say that it is a balance of trade-offs, wherein if you reduce the number of free electrons via doping, the resistance increases; if you increase the number of free electrons via doping, the resistance is lowered but the diffusion length is shortened. Thus, in conventional photovoltaic devices no ideal settings of factors can be reached, but rather, a compromise of settings and/or factors is reached which yields a device that does not give the perfect performance, but the factors are compromised so that the best performance is given for the semiconductor material and the environment at hand.

Accordingly, the design and manufacture of conventional photovoltaic devices has several inherent problems all of which have limited conventional photovoltaic devices from achieving their true potential in the market place as well as the expectations of the physics. Because of the fundamental design limitations, fundamental materials limitations, and manufacturing limitations, the costs of manufacturing conventional photovoltaic devices is high. The manufacture, the materials, and the inherent fundamental problems severely limit both the performance of the conventional photovoltaic cell as well as reducing the flexibility of the system architectural design. In order to allow enhanced optimization, design, efficiencies, and performance increases of photovoltaic devices as well as flexibility of architectural design, a new photovoltaic architecture and design is needed.

SUMMARY OF THE INVENTION

Briefly stated and in various representative aspects, the present invention provides a magnetically polarized photonic device using a graded band gap. The magnetically polarized photonic device having a first, second, third, and fourth surfaces. Where the first and the second surfaces are substantially parallel and where the third and fourth surfaces are substantially parallel with the third and forth surface are substantially perpendicular to the first surface. A first contact element with a fifth and sixth surface being electrically coupled to the fourth surface of the semiconductor device and a second contact element having a seventh surface and an eighth surface with the second contact electrically coupled to the third surface of the semiconductor device.

Additional advantages of the present invention will be set forth in the Detailed Description which follows and may be obvious from the Detailed Description or may be learned by practice of exemplary embodiments of the invention. Still other advantages of the invention may be realized by means of any of the instrumentalities, methods or combinations particularly pointed out in the claims.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent to skilled artisans in light of certain exemplary embodiments recited in the Detailed Description, wherein:

Those skilled in the art will appreciate that elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms 'first', 'second', and the like herein, if any, are used inter alia for distinguishing between similar elements and not necessarily for describing a sequential or chronological order. Moreover, the terms front, back, top, bottom, over, under, and the like in the Description and/or in the claims, if any, are generally employed for descriptive purposes and not necessarily for comprehensively describing exclusive relative position. Skilled artisans will therefore understand that any of the preceding terms so used may be interchanged under appropriate circumstances such that various embodiments of the invention described herein, for example, are capable of operation in other orientations than those explicitly illustrated or otherwise described.

DETAILED DESCRIPTION OF EXEMPLARY EMBODIMENTS

The following descriptions are of exemplary embodiments of the invention and the inventors' conceptions of the best mode and are not intended to limit the scope, applicability or configuration of the invention in any way. Rather, the following Description is intended to provide convenient illustrations for implementing various embodiments of the invention. As will become apparent, changes may be made in the function and/or arrangement of any of the elements described in the disclosed exemplary embodiments without departing from the spirit and scope of the invention.

Before addressing details of embodiments of the present invention described below, some terms are defined and/or clarified.

The term "defect" is intended to mean any interruption or change in the crystal lattice structure of a material. By way of example only, there are several different kinds of defects that can be found in crystalline material such as, but not limited to, point defects, line defects, inclusions, and planar defects. Typically, these defects can be counted and put in terms of defects per cubic centimeter.

The term "band gap" is intended to mean an energy range in a semiconductor material where no electron states can exist. The band gap generally refers to the energy difference between the top of the valence band and the bottom of the conduction band. Typically, this energy difference is of order ranging from one (1.0) eV to two (2.0) eV, but can range from about zero (0.0) eV to about eight (8.0) eV. It should be understood that a material(s) with a large band gap is an insulator; a material(s) with a smaller band gaps are semiconductors, and a material(s) with very small or no band gap is a conductor or semi-metal. Moreover, every material has its own characteristic band gap and energy band structure.

Figure 3:
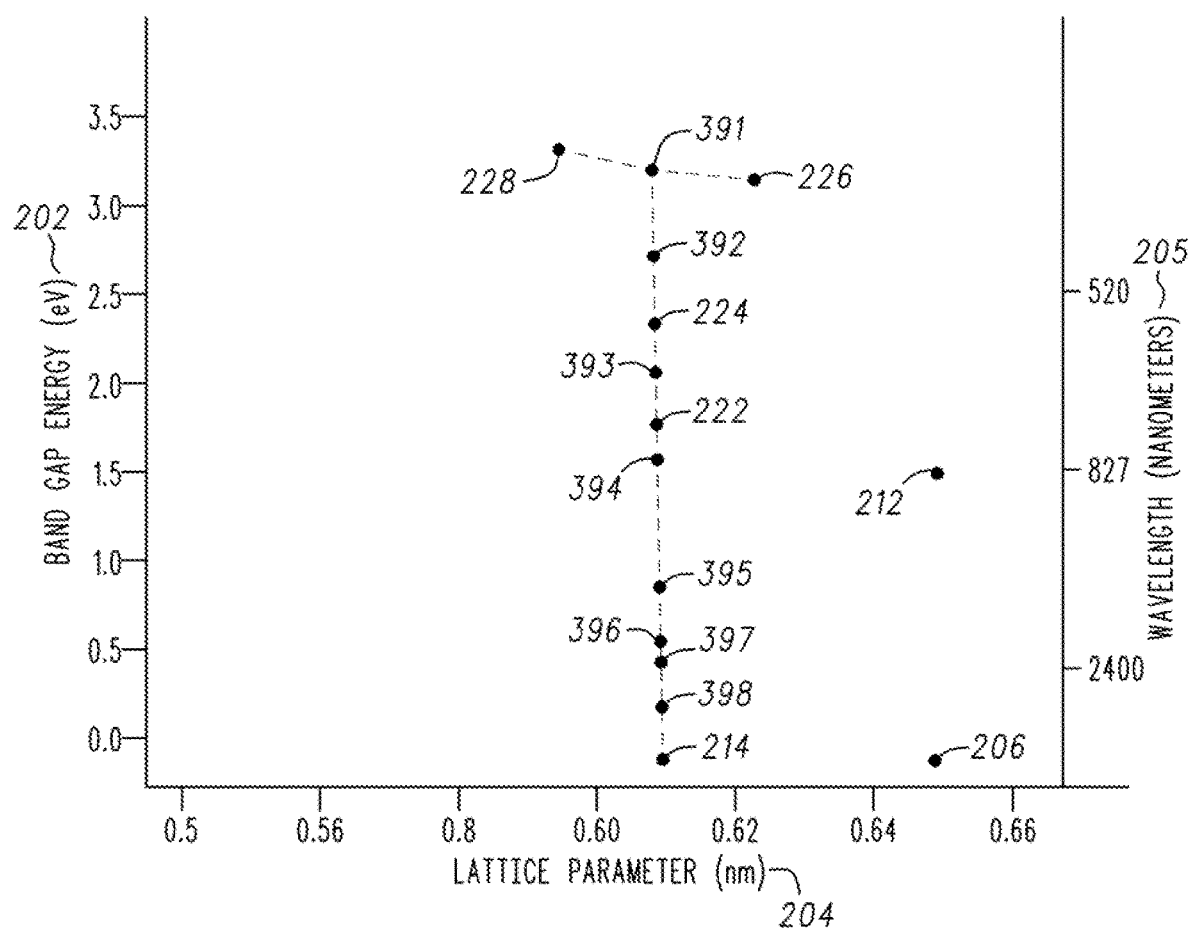
FIG. 3 is a greatly simplified graph of Energy Band Gap (eV), Lattice Parameter (Nanometers), and Wavelength (Nanometers) of a material composition set.

The term "graded band gap" is intended to mean a structure of materials wherein the band gaps of the materials are dynamically changed while still generally maintaining the structural crystallinity of the material. Also, graded band gap refers to a zone in the device where the band gap changes from one band gap energy to different band gap energy over a distance on the order of microns. Although, the highest efficiency will likely result from a continuously graded band gap the term "graded band gap" is intended to include all band gap transition zones that might include sections of constant band gap or band gap discontinuities that may reduce efficiency, but still operated overall to induce free electrons and free holes to move from the regions with larger band gaps toward the regions with smaller band gaps. It should be understood that a slope can be detrimined wherein a of a curve can be changed graded band gap can change in a gradual manner where the band gap energies slowly change of an order of a few percent though a distance where photons are largely absorbed. The graded band gap values move The term "lattice parameter" is intended to mean the constant distance between unit cells in a crystal lattice. Generally, lattice dimensions have three constants (a, b, and c and typically measured in Nanometers). However, when a set of materials has similar or identical crystal structure, a single number is chosen to represent the atomic spacing. As shown in FIG. 3, the lattice parameter uses only a single number to describe the lattice structure because all of these materials have similar crystal structure or unit cell. However, it should be understood that other crystalline configuration and geometric patterns could be used as well.

Figure 2:
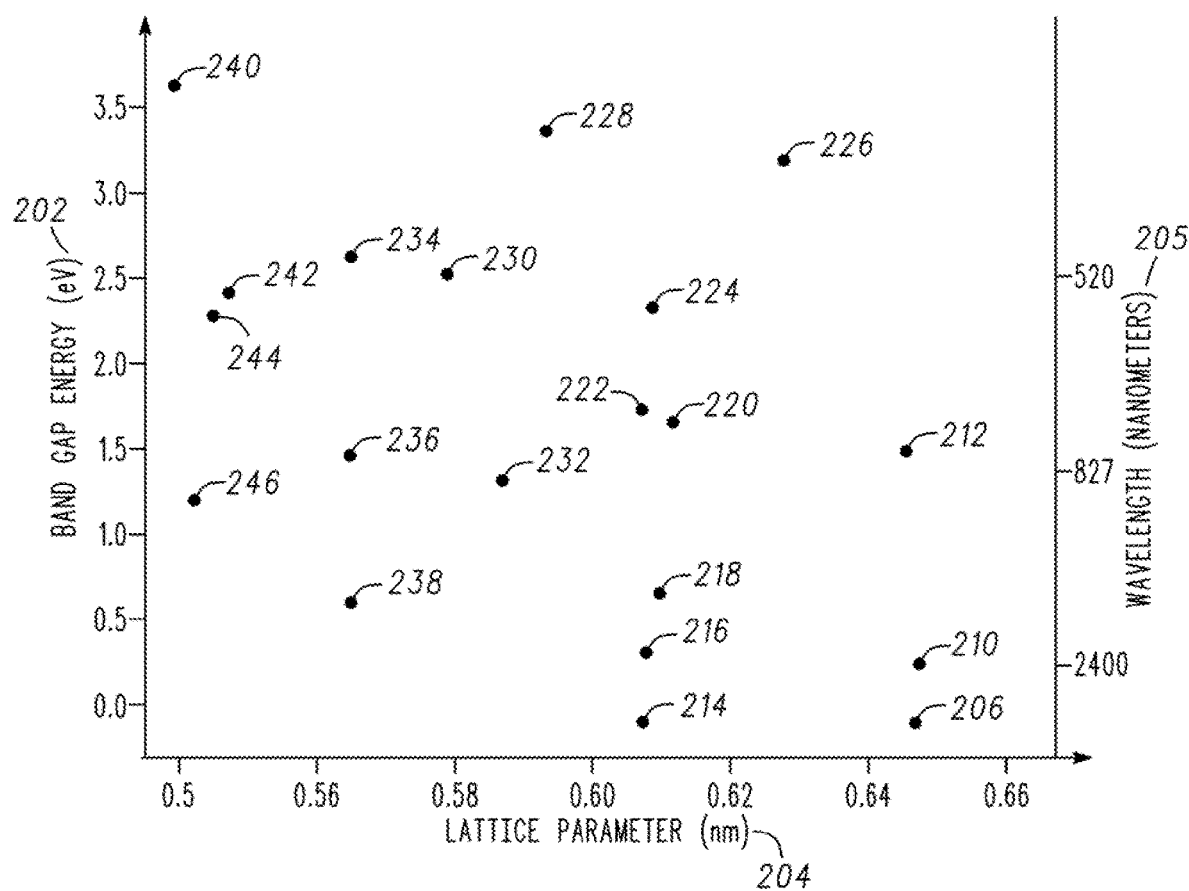
FIG. 2 is a greatly simplified graph of Energy Band Gap (eV), Lattice Parameter (Nanometers), and Wavelength (Nanometers) of a variety of semiconductor materials.

The term "wavelength" is intended to mean a distance between sequential peaks or crests of any photon or light wave. Typically, the wavelength is measured in Nanometers as shown in FIG. 2. The wavelengths identified in FIG. 2 are the wavelengths of light that are emitted from any light emitting source such as, but not limited to, sun light, a light emitting device, a light emitting diode (LED), or the like.

Further, it should be understood that the wavelength of light (photon) is related to its energy by the relationship: $E=hc/\lambda$, where E is energy, h is Plank's constant, c is the speed of light, and $\lambda$ is the wavelength of light.

The term "III-V" is intended to indicate the set of semiconductor materials that are formed by combining approximately equal amounts of elements from column 3 of the periodic chart (Boron, Aluminum, Gallium, Indium, and Thallium) with elements from column 5 of the periodic chart (Nitrogen, Phosphorous, Arsenic, Antimony, and Bismuth). These combine to form semiconductors including but limited to, Gallium Arsenide, Indium Antimonide, Gallium Antimonide, and Aluminum Phosphide, and the like.

The term "II-VI" is intended to indicate the set of semiconductor materials that are formed by combining approximately equal amounts of elements from column 2 of the periodic chart (Zinc, Cadmium, and Mercury) with elements from column 6 of the periodic chart (Oxygen, Sulfur, Selenium, and Tellurium). These combine to form semiconductors including but not limited to, Cadmium Telluride, Zinc Telluride, Cadmium Selenide, and Mercury Selenide, and the like. Although Manganese and Magnesium are not in column II of the periodic chart, we include them in the II-VI materials set because of their compatibility with Selenium and Tellurium to form semiconductors with favorable band gaps and lattice constants.

Figure 1:
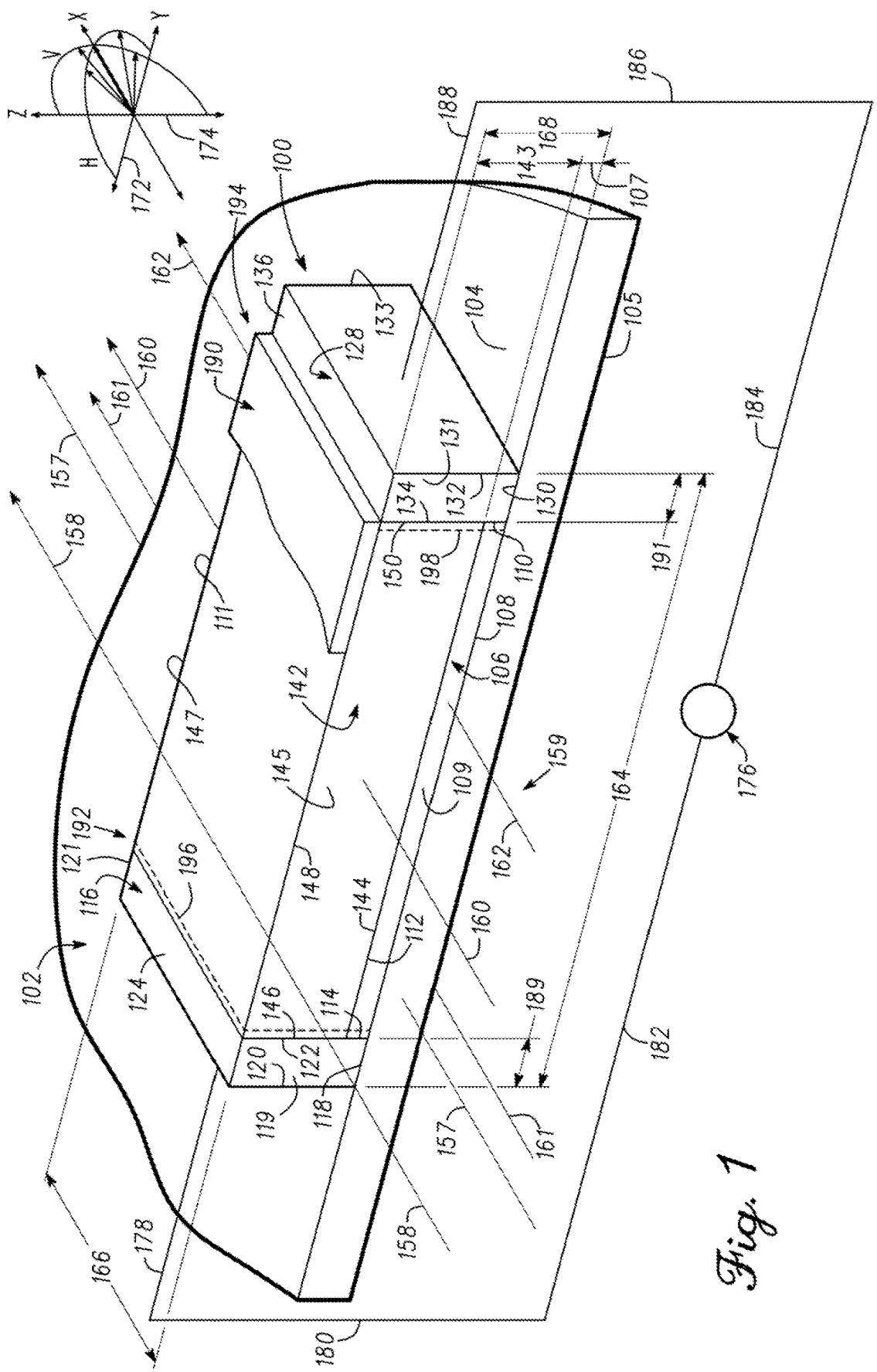
FIG. 1 is a greatly enlarged simplified sectional perspective illustration of a magnetically polarized photonic device with magnetic field lines extending through the magnetically polarized photonic device.

FIG. 1 is a greatly enlarged simplified perspective schematic illustration of a magnetically polarized photonic device 100 having a length 164 and width 166 and height 168. Magnetically polarized photonic device 100 includes a substrate 102 having a surfaces 104 and 105, an annihilation layer 106 having surfaces 108, 109, 110, 111, 112, and 114, contacts 116 and 128 having surfaces 118, 119, 120, 121, 122 and 124 and surfaces 130, 131, 132, 133, 134, and 136, respectively, and a graded band gap layer 142 having surfaces 144, 145, 146, 147, 148, and 150. A magnetic field indicated by a plurality of magnetic field lines 159 having individually identified magnetic field lines indicated by arrows 157, 158, 160, 161, and 162 are shown with magnetic field line 157 traversing through substrate 102, with magnetic field line 160 traversing through graded band gap layer 142, with magnetic field line 162 traversing through annihilation layer 106, with magnetic field line 158 traversing over magnetically polarized photonic device 100, and magnetic field line 161 traversing under magnetically polarized photonic device 100. A load 176 is coupled to contacts 116 and 128 by electrical traces 188, 186, 178, 180, 182, and 184.

Substrate 102 can be made of any suitable material having surface 104. Typically, substrate 102 is made of any suitable semiconductor material or insulative material such as, but not limited to, Silicon (Si), Gallium Antimonide (GaSb), Indium Arsenide (InAs), Cadmium Selenide (CdSe), Indium Antimonide (InSb), Gallium Arsenide (GaAs), Mercury Cadmium Telluride (HgCdTe), Cadmium Selenide (CdSe), ionic salt, metal oxide, ceramic, glass, or the like. Generally, substrate 102 uses materials that have a band gaps wide enough so that current flow is inhibited.

As shown in FIG. 1, an annihilation layer 106 is disposed on surface 104 of substrate 102. Generally, annihilation layer 106 can be made of any suitable material or combination of materials such as, but not limited to, Mercury Cadmium Telluride (HgCdTe), Mercury Cadmium Selenide (HgCdSe), Indium Arsenide Antimonide (InAsSb), or the like. Further, annihilation layer 106 can be made of the same elemental materials that are used for making graded band gap layer 142. However, it should be understood that annihilation layer 106 is made with a high degree of crystal defectivity, disorientation, and/or imperfections, thereby facilitating the collection and recombination of free electrons and free holes that are generated from the plurality of photons 404, as shown in FIGS. 4, 5, 6 and 7, that strike and subsequently generate free electrons and free holes in the graded band gap layer 142 as described hereinbelow.

Typically, annihilation layer 106 is deposited on substrate 102. Annihilation layer 106 can be made by any suitable method or technique such as, but not limited to, Epitaxy, Molecular Beam Epitaxy (MBE), Chemical Beam Epitaxy (CBE), Chemical Vapor Deposition (CVD), Physical Chemical Deposition (PCD), Physical Vapor Deposition (PVD), or the like. It should be understood that the equipment mentioned above are capable of changing the composition of the deposited material minutely so as to change the composition of the deposited material from one material to another material in a dynamic matter. Making annihilation layer 106 with a high degree of crystal defectivity can be achieved by suitable method or technique. Typically, defectivity increases when the process parameters such as, temperature, pressure, gas flows ratios of reactant materials, or the like are slightly away from to or out of the process window for excellent crystal growth. By way of example, with growth process parameters being set for excellent crystal growth, changing the process temperature by to fifty percent lower then the optimum process window, generally, produces an annihilation layer 106 that has sufficient imperfections and defects to act as recombination sites.

Generally, measurement of defectivity can be achieved by any suitable method or technique such as, but not limited to, optically counting of defects, measurement of x-ray diffraction measurements, and/or measurement of photon-induced carrier lifetimes. With regard to optically counting of defects, typically, the surface of the material to be measured is subjected to an etch solution with decorates the defects and generates a pit where a defect is present. When using the optical method, the results are presented as a defect density per unit area, but this can be related to a defect density number per cubic centimeter. The most accurate measure of defectivity for this device is the photon-induced carrier lifetime. The reason for this preference in methodologies is because the photon-induced carrier life time method takes into account and includes specific device design and intended operation of annihilation layer 106.

Generally, while any suitable defectivity amount can be used, it should be understood that defectivity is application specific and is somewhat variable depending upon the material set. The crystal defectively and disorientation assist in a recombination of free electrons and free holes that are produced by the plurality of photons 404 (illustrated in FIG. 4) that strike surface 148 and move to annihilation layer 106 are similar to materials used in graded band gap layer 142. Typically, annihilation layer 106 can be made of any suitable material such as, but not limited to, defect filled HgCdTe, HgCdSe, InAsSb, or the like. However, the material used for the annihilation layer 106 should be a material that accepts free electrons and free holes readily from there respective bands, i.e., free holes from the valence bands and free electrons from the conduction band, and that stimulate recombination of free holes and free electrons.

Thickness 107 of annihilation layer 106 can be made to any suitable thickness 107. It should be understood that thickness of annihilation layer 106 is application specific and can have a large amount of variability. However, generally, annihilation layer 106 can have thicknesses 107 that can range from a monolayer to 10.0 microns, with a modicum range from 0.5 microns to 5.0 microns, and a preferred range from 0.8 microns to 1.2 microns.

Also, depending upon the selection of the materials used to make annihilation layer 106, annihilation layer 106 can be graded as described hereinbelow such that band gap energy can be tuned or configured in such a way to facilitate the recombination of free electrons and free holes after those free electrons and free holes have passed through graded band gap layer 142.

As shown in FIG. 1, graded band gap layer 142 is disposed on surface 112 of annihilation layer 106. Generally, graded band gap layer 142 can be made of any suitable material or combination of materials that have similar lattice parameters and differing band gap energies (eV), such as, but not limited to, HgCdTe, HgCdSe, InAsSb, Mercury Telluride (HgTe), InSb, Cadmium Telluride (CdTe), Mercury Selenide (HgSe), Indium Arsenide (InAs) or, Aluminum Gallium Antimonide (AlGaSb), Indium Arsenide Antimonide (InAsSb), HgCdSe, Cadmium Zinc Selenide Telluride (CdZnSeTe), Cadmium Manganese Telluride (CdMnTe), and the like.

Figure 5:
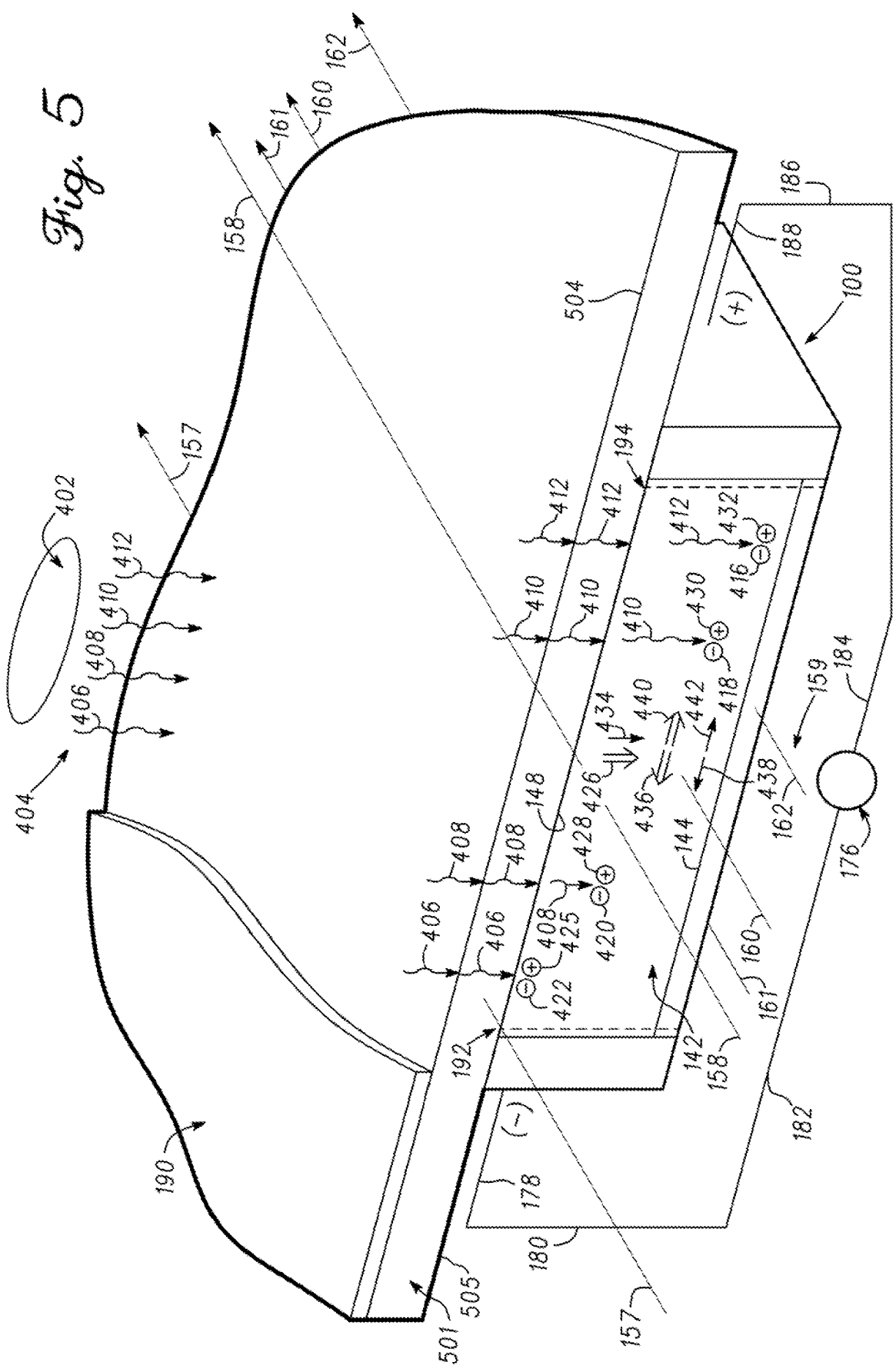
FIG. 5 is a greatly enlarged simplified perspective inverted illustration of a magnetically polarized photonic device further including photonic source; as generally depicted in FIGS. 1 and 4 including formation of free electrons and free holes.

As shown in FIGS. 1 and 5, a layer 190 can be disposed over magnetically polarized photonic device 100 which can have several purposes such as, but not limited to, a filter, a protective coating, a lens, and the like. More specifically and referring to FIG. 1, layer 190 can be disposed on surface 148 of graded band gap layer 142 and in FIG. 5 layer 190 can be disposed on surface 504 of substrate 501 above graded band gap layer 142. It should be understood that selection of surfaces 104 and 105 of substrate 102, and surfaces 504 and 505 of substrate 501 are dependant on the materials involved and device specific design. For instance, as shown in FIG. 5, when it is desired to have graded band gap layer 142 to interact with photons having a certain wavelength, substrate 501 has to be transparent to that wavelength. Accordingly, layer 190 can be made to selectively pass certain wavelengths while excluding other wavelengths, thereby providing a selective filter. Additionally, it should be understood that layer 190 can be made to pass certain wavelengths of photons into graded band gap layer 142 and reflect other wavelengths of photons. Further, it should be understood that layer 190 could have multiple layers that could be utilized for a variety of purposes. Layer 190 can be disposed on or over graded band gap layer 142 by any suitable method or technology well known in the art such as, but not limited to, those that are discussed herein. Additionally and in some cases, layer can be laminated on or over graded band gap layer 142.

Depending upon specific application, design, and materials selected, layer 190 can be any suitable photonic device such as, but not limited to an antireflective layer, a selective mirror, a focusing layer, reflector, or the like.

Referring now to both FIGS. 1 and 2, FIG. 2 is a greatly simplified graph of Energy Band Gap (eV) 202, Lattice Parameter (Nanometers) 204, and photon Wavelength (Nanometers) 205 of a variety of semiconductor materials, with Energy Band Gap (eV being on the left-hand Y axis, with photon Wavelength being on the right-hand Y axis, and with Lattice Parameter being on the X axis). As shown in FIG. 2, a specific semiconductor material (represented as a numerically identified dot) can be associated with a specific number which represents the lattice parameter. Additionally, that specific semiconductor material can be associated with a specific number which represents band gap energy (eV). Also, that specific semiconductor material can be associated with a specific wavelength of light wherein the photon(s) can be absorbed by that specific semiconductor material.

For the sake of clarity, many of the available semiconductor materials have not been identified. However, it should be understood by one of ordinary skill in the art, that these materials and future materials are contemplated by this invention.

By way of example, FIG. 2 illustrates a limited number of materials, dot numerically represented by 206 is Mercury Telluride (HgTe), dot numerically represented by 210 is Indium Antimonide (InSb), dot numerically represented by 212 is Cadmium Telluride (CdTe), dot numerically represented by 214 is Mercury Selenide (HgSe), dot numerically represented by 216 is Indium Arsenide (InAs), dot numerically represented by 218 is Gallium Antimonide (GaSb), dot numerically represented by 220 is Aluminum Antimonide (AlSb), dot numerically, represented by 222 is Cadmium Selenide (CdSe), dot numerically represented by 224 is Zinc Telluride (ZnTe), dot numerically represented by 226 is Manganese Telluride (MnTe), dot numerically represented by 228 is Manganese Selenide (MnSe), dot numerically represented by 230 is Cadmium Sulfide (CdS), dot represented by 232 is Indium Phosphide (InP), dot represented by 234 is Zinc Selenide (ZnSe), dot represented by 236 is Gallium Arsenide (GaAs), dot represented by 238 is Germanium (Ge), dot represented by 240 is Zinc Sulfide (ZnS), dot represented by 242 is Aluminum Phosphide (AlP), dot represented by 244 is Gallium Phosphide (GaP), and dot represented by 246 is Silicon (Si).

As shown in FIG. 2, some vertical patterns of materials can be seen wherein various materials have similar Lattice Parameters. By way of example only, materials HgSe 214, InAs 216, GaSb 218, AlSb 220, CdSb 222, and ZnTe 224 have a Lattice Parameter of about or approximately 0.61 nm, thereby indicating that these different materials have similar crystal lattice structures which enables the potential stacking and/or alignment of some of these different materials to be deposited on each other and have low number of imperfections or defects.

Referring now to FIG. 3, FIG. 3 is a greatly simplified graph of Energy Band gap (eV), Lattice Parameter (Nanometers), and Wavelength (Nanometers) of a material composition set illustrating the grading of material compositions to adjust the band gap while maintaining Lattice parameter characteristics. By way of example only, using a limited number of materials, dot numerically represented by 214 is Mercury Selenide (HgSe), dot 222 is Cadmium Selenium (CdSe), dot 224 is Zinc Telluride (ZnTe), dot 226 is Manganese Telluride (MnTe), and dot 228 is Manganese Selenide (MnSe). Additionally, it should be understood that the materials found in FIG. 3 are not intended to be an all inclusive list. As shown in FIG. 3, some materials have very similar lattice parameters in a vertical direction.

By way of example only, using the lattice parameter of approximately 0.645 nanometers (nm), a vertical grouping of materials fall within and around 0.647 nm. The grouping includes HgTe, InSb, and CdTe. In yet another example, using the lattice parameter of approximately 0.610 nm a vertical grouping of fall within and around the 0.610 nm. The grouping includes HgSe, InAs, GaSb, AlSb, CdSe, and ZnTe. It should be understood that other vertical groupings can be used that have not been mentioned here.

By using FIG. 2 or a similar graph and grouping materials into vertical groups, a material set is developed for making graded band gap layer 142. Also, as shown in FIG. 2, Wavelengths (nm) and corresponding Energy Band Gaps to those wavelengths are shown. Thus, by making the correct material selection, a correct grouping of materials with the correct band gaps can be made so that free electrons and free holes (See FIGS. 4 and 5) can be captured and driven to contacts 116 and 128. Where upon the captured free electrons and free holes can be applied to load 176 for useful work.

Generally, graded band gap layer 142 can be generated by growing a layer of continuously modified material composition within a vertical grouping. It should be understood by one of ordinary skill in the art that a certain amount of flexibility exists in the selection of materials used to make graded band gap layer 142 and annihilation layer 106.

Referring now to FIGS. 1, 2 and 3 and by way of example only, graded band gap layer 142 can be generated by growing a layer of continuously modified material composition within the selenide series of materials, indicated by dots 214 and 222. As shown In FIG. 3, HgSe 214, indicated by dot 214 has a band gap of approximately −0.1 eV and a lattice parameter of approximately 0.61 nm. Also in FIG. 3, it is shown that CdSe (222) has a band gap of approximately 1.7 eV and a lattice parameter of approximately 0.61 nm. Intermediate band gap materials can be created by intermixing CdSe and HgSe. By way of example, the selenide material with half Cadmium and half Mercury ($Cd_{0.5}Hg_{0.5}Se$) has a band gap of approximately 0.8 eV and a lattice parameter of approximately 0.61 nm, and is represented by dot 395 in FIG. 3. Similarly, a mixture of 90% CdSe and 10% HgSe ($Cd_{0.9}Hg_{0.1}Se$) has a band gap of approximately 1.52 eV and is shown by dot 394 in FIG. 3. Similarly, dot 396 represents $Cd_{0.3}Hg_{0.7}Se$ and has a band gap of approximately 0.44 eV, dot 397 represents $Cd_{0.25}Hg_{0.75}Se$ and has a band gap of approximately 0.35 eV, and dot 398 represents $Cd_{0.05}Hg_{0.95}Se$ and has a band gap of approximately 0.19 eV. All of these material compositions have a lattice parameter of approximately 0.61 nm.

For example, graded band gap layer 142 can be created by growing a series of continuously changing composition material that initially has a composition of 5% Cadmium $Cd_{0.05}Hg_{0.95}Se$ and where the Cadmium content is continuously increased to 100% (CdSe) by increasing the atomic flux of Cadmium while decreasing the atomic flux of Mercury during the growth while maintaining ample Selenium with which the Cadmium and Mercury can react to form approximately perfect crystalline material with lattice parameter approximately 0.61 nm. By way of example only, this continuously changing composition could be accomplished by growing the graded band gap layer in a chemical vapor deposition machine that uses three precursor gasses; one precursor containing Selenium, one containing Cadmium, and one containing Mercury. By way of example only, by creating a stream of gas that is 5% Cadmium precursor and 95% Mercury precursor into the growth area with sufficient Selenium precursor to induce approximately perfect crystal growth, a layer of $Cd_{0.05}Hg_{0.95}Se$ can be grown. By then increasing the flow of Cadmium precursor while decreasing the flow of Mercury precursor which maintaining ample Selenium precursor for approximately perfect crystal growth, the atomic content of Cadmium in the growth layer will continually increase while the atomic content of Mercury in the growth layer will decrease. At the moment when the Cadmium precursor flow was 25% and the mercury precursor content was 75% the material growing on the top of the graded band gap layer 142 would be $Cd_{0.25}Hg_{0.75}Se$ and would be represented by dot 397 in FIG. 3. As the growth continued and the precursor content continued to change, the growth would pass continuously through several compositions, 396, 395, and 394, and would eventually cease to change when Mercury precursor content was zero percent and the composition would be pure CdSe (222) with a band gap of approximately 1.7 eV.

By way of example only the process of creating the graded band gap layer 142 can be continued to higher band gap energies by continuously changing the composition to include increasing amounts of ZnTe (224) as the content of CdSe (222) decreases. This could be accomplished by using two additional precursors that contain Zinc and Tellurium. Intermediate composition 393 represents the point when approximately equal amounts of ZnTe and CdSe are incorporated into the film and has the chemical composition $Zn_{0.5}Cd_{0.5}Te_{0.5}Se_{0.5}$ and has a band gap of approximately 2.0 eV. This composition can further be continuously changed to the point of 100% ZnTe (dot 224) and 0% CdSe with a band gap of approximately 2.2 eV.

This process can be further continued to higher band gap by intermixing $MnSe_{0.5}Te_{0.5}$ (dot 391) with ZnTe (224). By way of example again, an intermediate composition along this path is dot 392 with a composition of $Zn_{0.5}Mn_{0.5}Te_{0.75}Se_{0.25}$. This composition can be derived from equal parts of composition 224 and 391 as, $(ZnTe)_{0.5}(MnSe_{0.5}Te_{0.5})_{0.5}$.

Another material system that can be used to make this device is the Mercury Cadmium Telluride ($Hg_xCd_{(1-x)}Te$). The Cadmium Telluride material system is similar to the previous system, in that the band gap can be modified continuously by altering the ratio of Mercury Telluride to Cadmium Telluride. It is different in that the lattice parameter is larger, and therefore this system must generally be grown on a different substrate to prevent excessive defects, but is similar in that fractional content of Mercury Telluride to Cadmium Telluride when continuously varied, results in a varied band gap. It should be understood by one of ordinary skill in the art, that other systems could be identified and used as well.

One version of this structure that is described herein is the growth of smaller band gap materials that have lattice parameter that are different from the primary substrate lattice parameter, and different from the primary lattice parameter of the majority of the graded band gap. It is possible to grow nearly perfectly crystalline material on a substrate or partial growth layer that has a different lattice parameter than the new material to be grown. As an example only, in the inverted structure (FIG. 5), the wider band gap portion of the graded band gap layer can be grown in the III-V system using a set of materials with 0.61 nm lattice parameter by starting from AlSb and increasing GaSb in place of AlSb to reduce the band gap. The band gap can be further reduced in a graded manner from that of GaSb to that of InAs by including an increasing content of InAs and a decreasing content of GaSb. This transition can continue to 100% InAs. Further band gap decreases at 0.61 nm lattice parameter in the III-V system is not possible with a known material. However, because the band gap of InAs is only slightly larger than that of an ideal annihilation layer, the final portion of the graded band gap layer can be made imperfectly by growing a material with a different lattice parameter on the InAs layer. Because this new portion of the graded band gap layer is imperfect, it will act simultaneously as a combination of a graded band gap layer and an annihilation layer. The modification in performance from building the structure in this way will be rather small, but building it in this way enables the use of materials for the bulk of the graded band gap layer that would not enable a perfect transition to the smaller band gaps and the annihilation layer. It is also understood that the annihilation layer can in general be combined with the smaller band gap regions of the graded band gap layer such that the annihilation of carriers is combined with a band gap gradient that forces the carriers to the bottom of the device.

It is understood that minor interruptions in the growth composition that might result in describing the graded band gap layer as non-continuous or interrupted or segmented are understood to have a minor impact on the performance of the device, and are also covered by our general description of a transition from one band gap to another band gap over a distance of order microns. It is also conceived and claimed herein, structures that include different rates of change in band gap as a function of thickness. It is important to note that the rate of band gap change with thickness is a trade-off between substantially complete absorption in the region of the graded band gap where the gap is approximately equal to the energy of the light being absorbed (accomplished most perfectly with a very thick layer), and minimizing the thickness to reduce resistance to flow and the time it takes a carrier to transit from where it is created in the structure to the annihilation layer. Generally, excessively thick layers such as, but not limited to, graded band gap layer 142 annihilation layer 106, and the like absorb more perfectly, but have excessive resistance, while thin layers have minimal resistance but absorb less perfectly. It may be advantageous to create the graded band gap layer in two sections: one section with slight grading to absorb more perfectly, and a second section with stronger grading to accelerate the carriers toward the annihilation layer. This structural variation would improve performance in situations where the light source contains a limited range for photon energies that can be absorbed in the layer with slight grading, and then accelerated over a short distance in the second section with strong grading.

Additionally, it is understood that photons absorb in the annihilation layer, and can contribute to a further increase in the power output of the magnetically polarized photonic device.

Referring to FIG. 1, as previously mention with regard to annihilation layer 106, it is sometimes useful to consider the materials selected for graded band gap layer 142 and utilize those same material selections for use in the annihilation later 106. By utilizing this technique to select material sets, it is sometimes possible to reduce the stress on the crystal structure throughout the entire material layers while still maintain a high defect density in annihilation 106.

Typically, graded band gap layer 142 is an epitaxially deposited material. The epitaxially deposited material allows for a crystal lattice structure to form. The deposited layer can be made by any suitable method or technique such as previously discussed with reference to annihilation layer 106. Since the deposition instrumentals have been discussed previously, they do not need to be repeated herein below except in pertinent part. However, it should be understood that deposition of graded band gap layer 142 is different from that of the annihilation layer 106 in that the crystalline structure of the material deposited for graded band gap layer 142 is important and the number of defects, imperfections, and the like should be as few as possible.

Graded band gap material is epitaxially deposited to a thickness 143 on annihilation layer 106. Typically, a small amount of material is epitaxially deposited that is similar or the same as the annihilation layer 106 such that the same chemical constituents are used. Typically, this initial material for graded band gap layer can range from 0.1 microns to 50.0 microns thickness, with a modicum thickness ranging from 5.0 microns to 30.0 microns, and a preferred thickness being 10.0 microns to 20.0 microns. So as to obtain a dynamically graded material that is lattice matched, while the previous material is still being deposited. New gases used for deposition are slowly allowed to enter the reaction chamber so the second new material is slowly deposited on the preceding dynamically graded material. Typically, this second new material can range from 0.1 microns to 50.0 microns thickness, with a modicum thickness ranging from 5.0 microns to 30.0 microns, and a preferred thickness range being 10.0 microns to 20.0 microns. This process can be continued for as many times that are desired or that are called for by the specific application. By allowing the deposited material to be dynamically deposited and by selecting the correct materials for deposition, a dynamically graded band gap layer 142 is capable of being deposited.

Referring now to FIG. 1, contact 116 having surfaces 118, 120, 122, and 124 and contact 128 having surfaces 130, 132, 134, and 136 are located on surfaces 146 and 150, respectively, of graded band gap layer 142 and on surface 114 and 110 of annihilation layer 106, respectively. Typically, contacts 116 and 128 can be made in any suitable configuration such as, but not limited to, conforming surfaces 146 and 150 of ends 192 and 194 of graded band gap layer 142, annihilation layer 106, either singly, combined, or in part of magnetically polarized photonic device 100. Contacts 116 and 128 are made to thickness 189 and 191, respectively. It should be know by one of ordinary skill in the art as to the typical thicknesses of electrical contacts in the art. Typically, contacts 116 and 128 conform to surfaces 146 and 150 of graded band gap layer 142 and surfaces 114 and 110 of annihilation layer 106. However, it should be understood that in some cases contacts 116 and 128 can have shapes other then what is shown in FIG. 1. By way of example only, in some cases contacts 116 and 128 can be dissimilar in size, wherein contact 116 has a larger surface area then contact 128. Additionally, doping regions, indicated by doted lines 196 and 198, of ends 192 and 194 can be used to enhance electrical conductivity to annihilation layer 106 and graded band gap layer 142. Typically, doping regions 196 and 198 are doped with any suitable dopant. With free electrons moving toward contact 116, an N-type dopant could be used and with free holes moving toward contact 128 a P-type dopant could be used. One of ordinary skill in the art should be able to determine the doping concentrations for the specific material compositions and device type.

Additionally, it should be understood that the planes of material of identical composition that make up the graded band gap layer 142 are at approximately ninety degree angles to the plane defined by doping region 192, whereas in conventional devices these planes of identical composition are either coplanar or parallel to the planes of dopant. Contacts 116 and 128 can be made of any suitable conductive or semiconductor material such as, but not limited to, metals, a combination of metal layers, alloys, semiconductor materials, and/or any combination of the above.

A plurality of magnetic field lines 159 represented by magnetic field lines 157, 158, 160, 161, and 162 are shown passing through and around magnetically polarized photonic device 100. More specifically, FIG. 1 indicates the direction of magnetic field lines 159 with magnetic field line 158 passing over top surface of graded band gap layer 142 and with magnetic field lines 160 passing through graded band gap layer 142, with magnetic field line 162 passing through annihilation layer 106, with magnetic field line 157 passing through substrate 102, and with magnetic file line 161 passing under substrate 102. It should be understood that magnetic field lines 159 is a force that is represented by lines 157, 158, 160, 161, and 162. While magnetic field lines 159 is shown to be perpendicular to the sectional surface of magnetically polarized photonic device 100, orientation of magnetic field lines 159 can be set at any suitable angle in the horizontal plane and vertical plane, illustrate by elements 172 and 174, respectively. As discussed later in the description of FIG. 4, the magnetic field direction is oriented orthogonal to the band gap gradient force direction. This is the orientation for maximum device efficiency and is shown at the intersection line of suitable horizontal angles 172 and vertical angles 174, but it should be understood that small variations from this ideal orientation will result in performance that is only slightly less than the ideal orientation would provide. A unique property of the band gap gradient is that it forcibly drives both free electrons and free holes in the same direction, as opposed to an electric field (either externally applied or internally generated in the diode structure of a conventional photovoltaic device) that pulls free electrons in one direction and free holes in another.

Magnetic field lines 159 can be generated by any suitable method or technology such as, but not limited to, a bar magnet, a rare earth magnet, an electromagnet, superconducting electromagnet, or the like. Generally, magnetic field 159 can range from 0.1 Tesla to 50.0 Tesla, with a nominal range from 0.5 Tesla to 10.0 Tesla.

Figure 4:
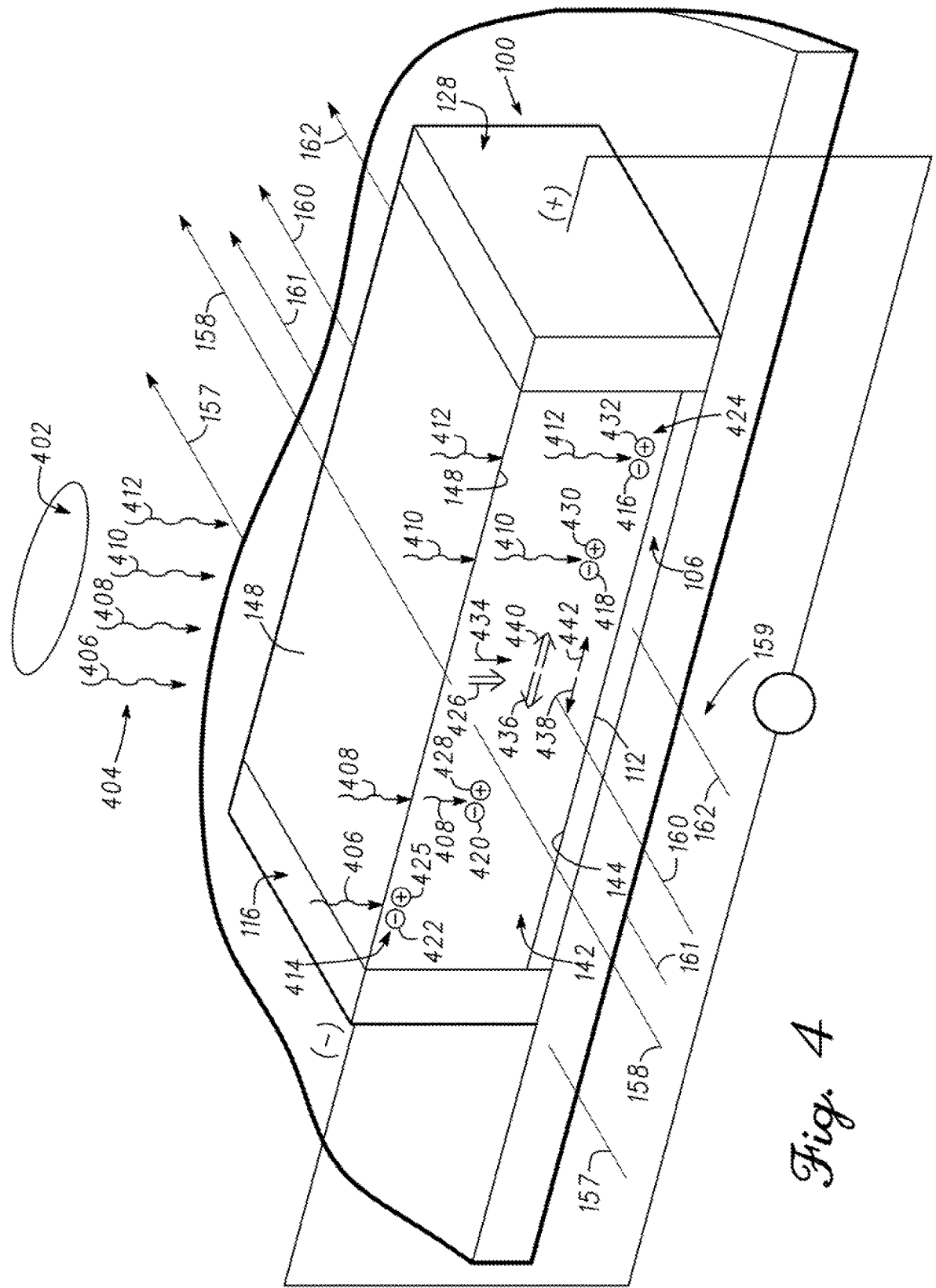
FIG. 4 is a greatly enlarged simplified perspective illustration of a magnetically polarized photonic device as generally depicted in FIG. 1 further including a photonic source and formation of free electrons and free holes.

FIG. 4 is a greatly enlarged simplified perspective illustration of a magnetically polarized photonic device 100 as generally depicted in FIG. 1 further including a photonic source 402 having a plurality of photons 404 with exemplary photons having identifying numbers 406, 408, 410, and 412. As shown in FIG. 4, photonic source 402 emits the plurality of photons 404 that flood surface 148 of magnetically polarized photonic device 100. When the plurality of photons 404 strike surface 148 of the graded band gap layer 142, at least a portion of the energy of the plurality of photons 404 is transferred to free electrons in the crystal lattice structure that make up the graded band gap layer 142. Which, depending upon the type of material, the structure of the graded band gap layer 142 material and the band gap energy, the plurality of free electrons 414 and the plurality of free holes 424 and, individually identified as free electrons 416, 418, 420, and 422 and free holes 425, 428, 430, and 432 are consequently generated in the graded band gap layer 142 and are capable of movement in the crystal lattice of the graded band gap layer 142.

For example, with graded band gap layer 142 being disposed such that band gap material having a large energy band gap is located on or about surface 148 and with other band gap materials having sequentially smaller energy band gaps being graded through energy band gap layer 142 with the smallest energy band gap material located on or about surface 112 of annihilation layer 106. By way of example, graded band gap layer 142 could have energy band gaps ranging from 2.5 eV to 0.8 eV and with the 2.5 eV band gap material being located at or near surface 148 at the top of the graded band gap layer 142, with the 0.8 eV material being located close to surface 112 of annihilation layer 106, and with other suitable band gap material being graded in between the 2.5 eV and the 0.8 eV material. Additionally, photons 406, 408, 410, and 412 could have photon energies of 2.5 eV, 2.0 eV, 1.7 eV, and 0.8 eV, respectively. As shown in FIG. 4, photon 406 strikes surface 148 and are absorbed near the surface 148. Absorption of photon 406 into crystal lattice structure of graded band gap layer 142 generates free electron 422 and free hole 425 because the crystal lattice material band gap and the photon 406 have the same energy, in this case 2.5 eV, free electron 422 and free hole 425 are now able to move in the crystal lattice structure of the graded band gap layer 142 toward annihilation layer 106.

Figure 6:
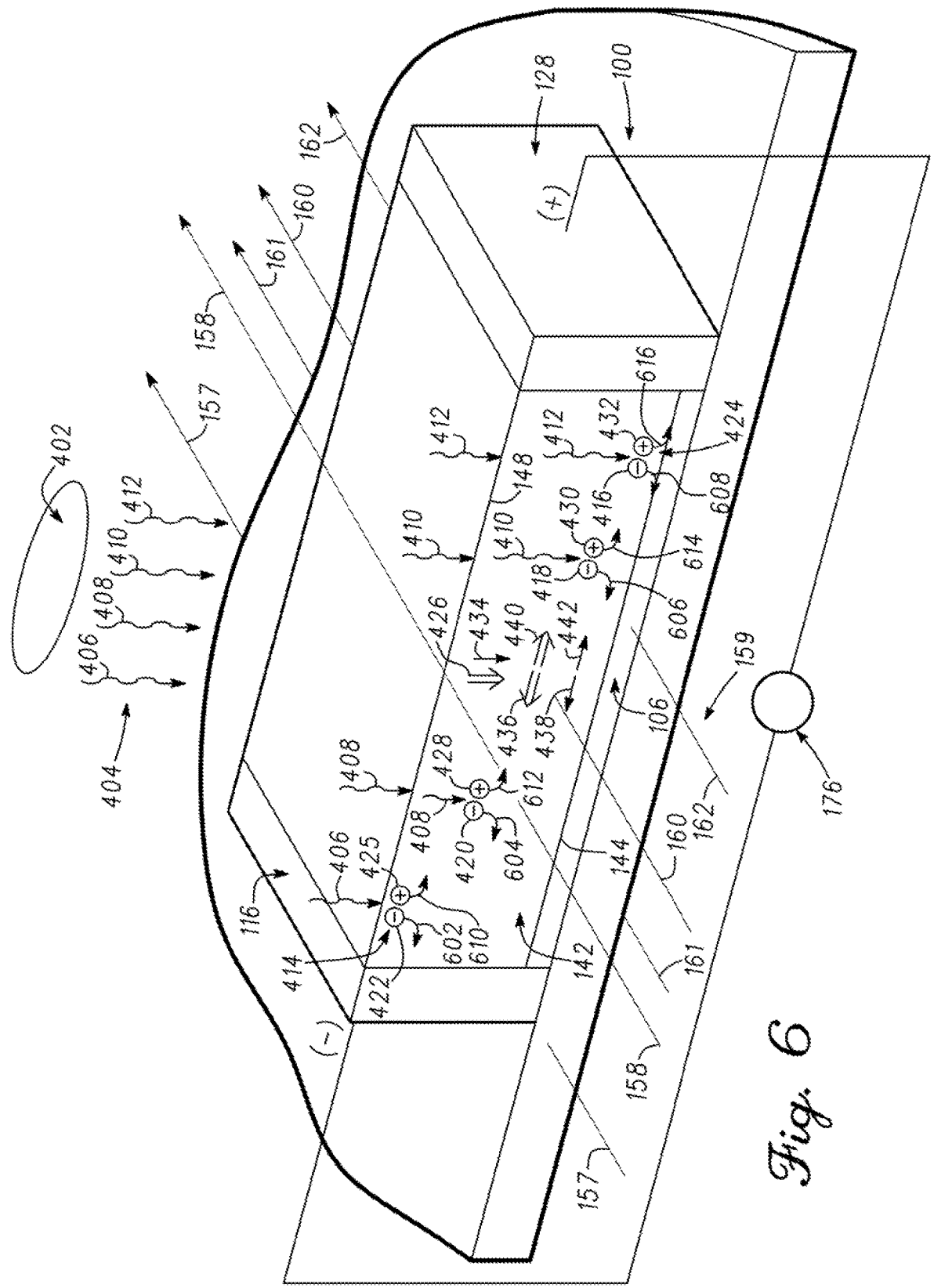
FIG. 6 is a greatly enlarged simplified perspective illustration of a magnetically polarized photonic device as generally depicted in FIGS. 1, 4 and 5, illustrating movement of free electrons and free holes in the graded band gap of the magnetically polarized photonic device.

However, as shown in FIG. 6, free electron 422 and free hole 425 are affected by magnetic field 159, wherein free electron 422 moves toward contact 116 as it moves toward annihilation layer 106, indicated by arrow 602, and free hole 425 moves toward contact 128 as it also moves toward annihilation layer 106, indicated by arrow 610.

As shown in FIG. 4, photon 408 strikes surface 148 and is absorbed by the crystal lattice material structure of graded band gap layer 142. However, photon 408 travels through graded band gap layer 142 until photon 408 is absorbed by material in graded band gap layer 142 having the same energy band gap as does photon 408. In this particular case, photon 408 has an energy of 2.0 eV and the material in the graded band gap also has an energy band gap of 2.0 eV. Photon 408 is subsequently captured and generates a free electron 420 and free hole 428 which have mobility in the crystal lattice structure of graded band gap layer 142. However, as previously described with reference to free electron 422 and free hole 425, magnetic field 159 moves free electron 420 toward contact 116 and moves free hole 428 toward contact 128, as indicated by arrows 604 and 612, respectively.

Photon 410 strikes surface 148 and is absorbed into the material of the crystal lattice structure of graded band gap layer 142. However, photon 410 travels farther than photon 408 into graded band gap layer 142 until photon 410 is absorbed by band gap material in graded band gap layer 142 having the same energy band gap as the energy of photon 410. In this particular case, photon 410 has an energy of 1.7 eV and the material in the graded band gap also has an energy band gap of 1.7 eV. Photon 410 is subsequently captured and generates a free electron 418 and free hole 430 both of which have mobility in the material of the crystal lattice structure of graded band gap layer 142. However, as previously described with reference to free electrons 420, and 422 and free holes 425 and 428, magnetic field 159 moves free electron 418 toward contact 116 and moves free hole 430 toward contact 128, as indicated by arrows 606 and 614, respectively.

When photon 412 strikes surface 148, photon 412 is not absorbed immediately into the crystal lattice structure of graded band gap layer 142, but travels for some distance and time in graded band gap layer 142. However, photon 412 travels through graded band gap layer 142 until photon 412 is absorbed by material in the graded band gap layer 142 having the same energy band gap as the energy of photon 412. In this particular case, photon 412 has an energy band gap of 0.8 eV and the material in the graded band gap layer 142 also has an energy of 0.8 eV. Photon 412 is subsequently captured and generates a free electron 416 and free hole 432 which have mobility in the crystal lattice structure of the graded band gap layer 142. However, as previously described with reference to free electrons 418, 420, and 422 and free holes 425, 428, 430, magnetic field 159 moves free electron 416 toward contact 116 and moves free hole 432 toward contact 128 as indicated by arrows 608 and 616, respectively.

Because of the interaction of the free electrons 422, 420, 418, and 416 and free holes 425, 428, 430, and 432 with magnetic field 159, free electrons 422, 420, 418, and 416 and free holes 425, 428, 430, and 432 are moved toward contact 116 and contact 128, respectively. Thus, the energy of the plurality of the free electrons and free holes 414 and 424 are capable of being captured. It should be understood that while only four photons 406, 408, 410, and 412 represent the plurality of photons, the number of photons that strike surface 148 are extremely large. Thus, it should be further understood that the number of the plurality of free electrons 414 and the plurality of free holes 424 is also extremely large.

Referring to FIG. 4, several force directions 426, 436, and 440 are indicated by double arrows, and several motion directions, 434, 438, and 442 are indicated by single arrows. Force direction 426 is the Band Gap Gradient Force on free holes and free electrons from the moment they are created by absorption of a photon, until they recombine with an opposite carrier (free electrons combine with free holes to annihilate each other and form either a secondary photon, or an energy loss event that produces mostly heat). It is understood that the vast majority of the carriers will not recombine with their opposite carrier type until they reach the annihilation layer, but it is inevitable that in any real device with many carriers of both types, some recombination can occur prematurely at any point in the device. It is understood that recombination prior to the carrier reaching the annihilation layer will result in a reduction in conversion efficiency. Motion direction indicated by arrow 434 is the direction of motion of both free holes and free electrons in response to the band gap gradient force 426. It should be understood that motion direction 434 of both free holes and free electrons also has a component of velocity that is also induced by the band gap gradient force. As previously described, the entire device is located in a magnetic field represented by lines 159. The field lines from this magnetic field are represented individually as arrows 157, 158, 160, 161, and 162, but it is understood that the entire device has approximately a uniform magnetic field including magnetic field lines penetrating through it everywhere. At every point in the device, carriers that move will experience a magnetic polarizing force equal to the cross product of the magnetic field with the velocity vector times the charge. The equation for this force is as follow: $F_{MP}=qv \times B$ where FMP is the Magnetic Polarizing Force on a moving charge carrier with velocity "v" and electric charge "q", with "B" the magnetic field intensity and "x" indicating the vector cross product operator. As seen in FIG. 4, the magnetic field direction is oriented orthogonal to the band gap gradient force direction. This is the orientation for maximum device efficiency, but it is understood that small variations from this ideal orientation will result in performance that is only slightly less than the ideal orientation would provide. A unique property of the band gap gradient is that it forcibly drives both free electrons and free holes in the same direction, as opposed to an electric field (either externally applied or internally generated in the diode structure of a conventional photovoltaic device) that pulls free electrons in one direction and free holes in another. The band gap gradient force is non-polarizing in magnetically polarized photonic device 100. In magnetically polarized photonic device 100, the free electrons and free holes acquire both motion and velocity, indicated by arrow 434 in the direction of the band gap gradient force 426. Both negatively charged free electrons and positively charged free holes having motion moving in direction 434, experience a Magnetic Polarizing Force 436 for free electrons and Magnetic Polarizing Force 440 for free holes that move free electrons to the left (direction 438) and free holes to the right (direction 442) in FIG. 4, respectively, thereby facilitating the transfer of the energy of the free electrons and free holes in their respective energy bands into electric energy as electric current 751 of FIG. 7 flowing against electric field 750 of FIG. 7. This energy transfer is accomplished at significantly higher efficiency than by conventional photovoltaic cells. Free electrons and free holes coexist throughout the band gap gradient layer 142 with free holes moving in the direction of electrode 128 and the free electrons moving in the direction of electrode 116 in FIG. 4.

FIG. 5 shows the inverted structure with like items identified with like numbers. As described earlier the substrate 501 is chosen so as to allow selected photons to pass though the substrate so that they can be absorb in graded band gap layer 142 that is disposed on surface 505 of substrate 501.

Referring to FIG. 6, the motion of the free electron 422 is indicated by curved motion arrow 602. The motion of free hole 425 is indicated by curved motion arrow 610. Likewise, carriers that are created throughout the band gap gradient are shown with their associated motion arrows that result from the respective Magnetic Polarizing Forces on each charged carrier that result from the motion induced by the band gap gradient force on each charged carrier.

Figure 7:
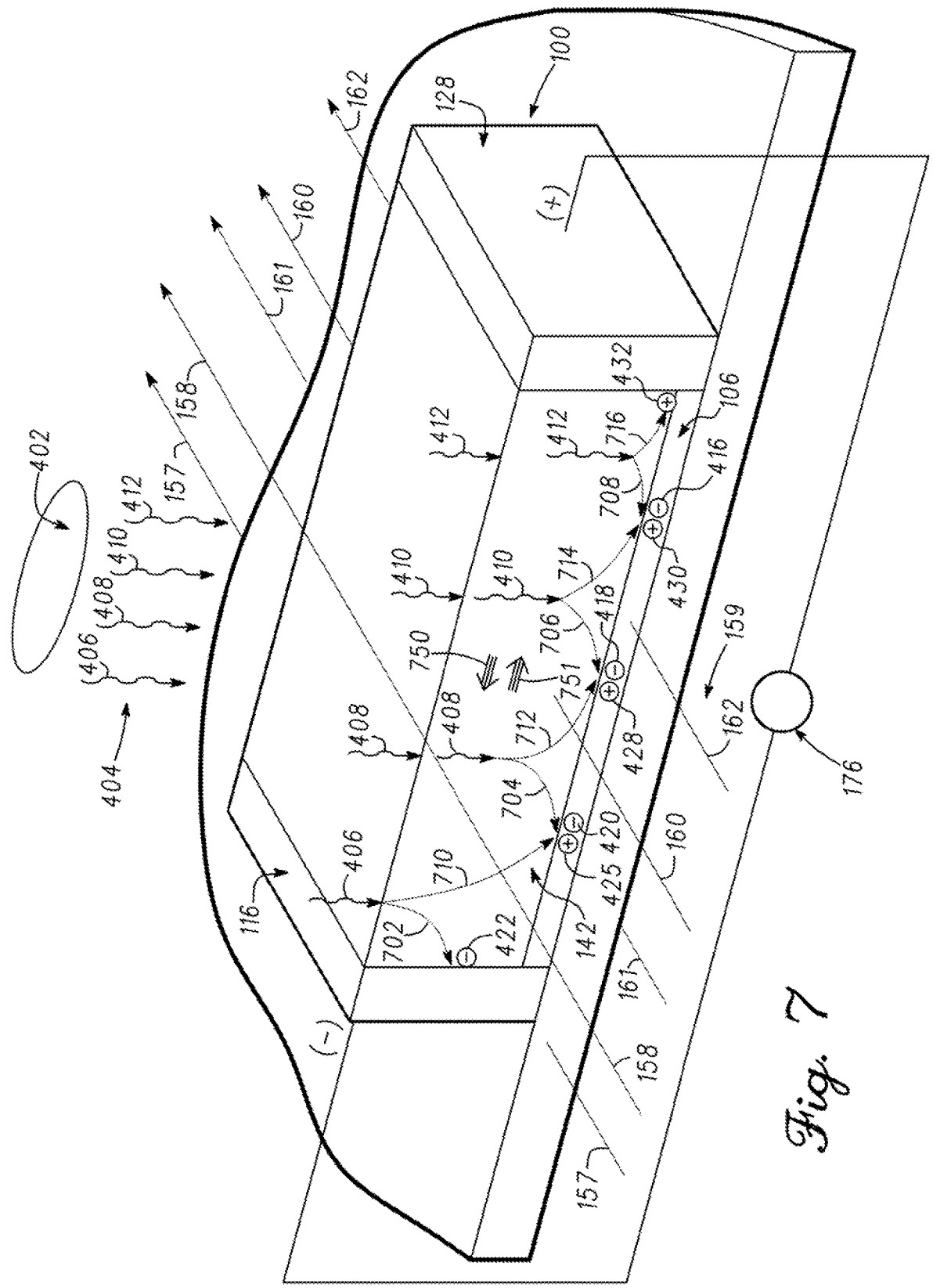
FIG. 7 is a greatly enlarged simplified perspective illustration of a magnetically polarized photonic device as generally depicted in FIGS. 1, 4, 5, 6 illustrating the capture and charge development of the magnetically polarized photonic device.

Referring now to FIG. 7, the general path traveled by each free electron and free hole in FIGS. 4, 5, and 6 are shown. Path 702 indicates the path taken by free electron 422 with the final position of free electron 422 shown in FIG. 7. Path 710 is the path taken by free hole 425 with the final position of free hole 425 shown in FIG. 7. Similarly, path 704 is the path taken by free electron 420, path 712 is the path taken by free hole 428, path 706 is the path taken by free electron 418, path 714 is the path taken by free hole 430, path 708 is the path taken by free electron 416, and path 716 is the path taken by free hole 432. In the present invention, one of the unique aspects of this device is that its output voltage (the electric potential between electrodes 128 and 116) can be significantly larger than the total band gap gradient drop experienced by each carrier. This potential establishes a lateral electric field 750 between electrodes 128 and 116, and exists throughout the graded band gap layer and annihilation layer. The output voltage of this device is generally a linear function of its length (the distance between electrodes 116 and 128). This is not the case with conventional photovoltaic devices where the output voltage is related directly to the band gap of the material in which the diode structure is created, and is limited to that value. As an example, the typical output of a silicon solar cell is approximately 0.7 eV, and is limited to approximately the total band gap of 1.1 eV. As can be seen in FIG. 7, the majority of carriers move from the point they were created by absorption of a photon down the graded band gap to the annihilation layer where they meet a carrier of opposite type and are annihilated (recombining in pairs and wasting the energy of the band gap of the annihilation layer). As each carrier moves down the band gap gradient, they lose potential energy by moving from a large band gap energy to a lower band gap energy. This energy is transferred into the lateral electric field 750 as charge motion against the electric field (a current against an electric field is electric power generation). The aspect ratio of FIG. 7 is not shown to scale and the distance between contacts 116 and 128 is generally many times (50-1000 times) the distance from the top of the band gap graded layer to the bottom of it. As a result of this high aspect ratio, in general, a plethora of free electrons and free holes move simultaneously down the band gap gradient and find their opposite charge with which they annihilate as the reach the bottom of the device (not shown). Because each carrier pair moves down a band gap energy of order 1 eV, each pair moves against approximately 1 volt of electric potential of the electric field 750. These carriers act as a series connection of small 1 volt power sources with small current that acts to create a large voltage at a small current. It should be understood that this device simply converts photonic energy into electric voltage and current, and that the efficiency with which this occurs is less than 100%. As an example, one coulomb of charge is $6.25 \times 10^{18}$ electric charges. If $6.25 \times 10^{18}$ photons/second of 1 eV energy (an incident power of 1 Watt) are absorbed perfectly into the 1 eV band gap portion of the graded band gap of a magnetically polarized photonic device of this type having a distance between electrodes 116 and 128 of 1 cm, the optimal output voltage under load would be of order 50 volts with a current of approximately 0.01 Amps. This would be an output power of 0.5 Watts corresponding to 50% power conversion. This conversion efficiency depends on many factors, including, but not limited to the mobility of the carriers (related to the resistance of the device), the minimum band gap of the annihilation layer, the magnetic field intensity, and the physical thickness of the device. It is possible in a structure of this type to exceed 50-75% conversion efficiency under optimum conditions.

Figure 8:
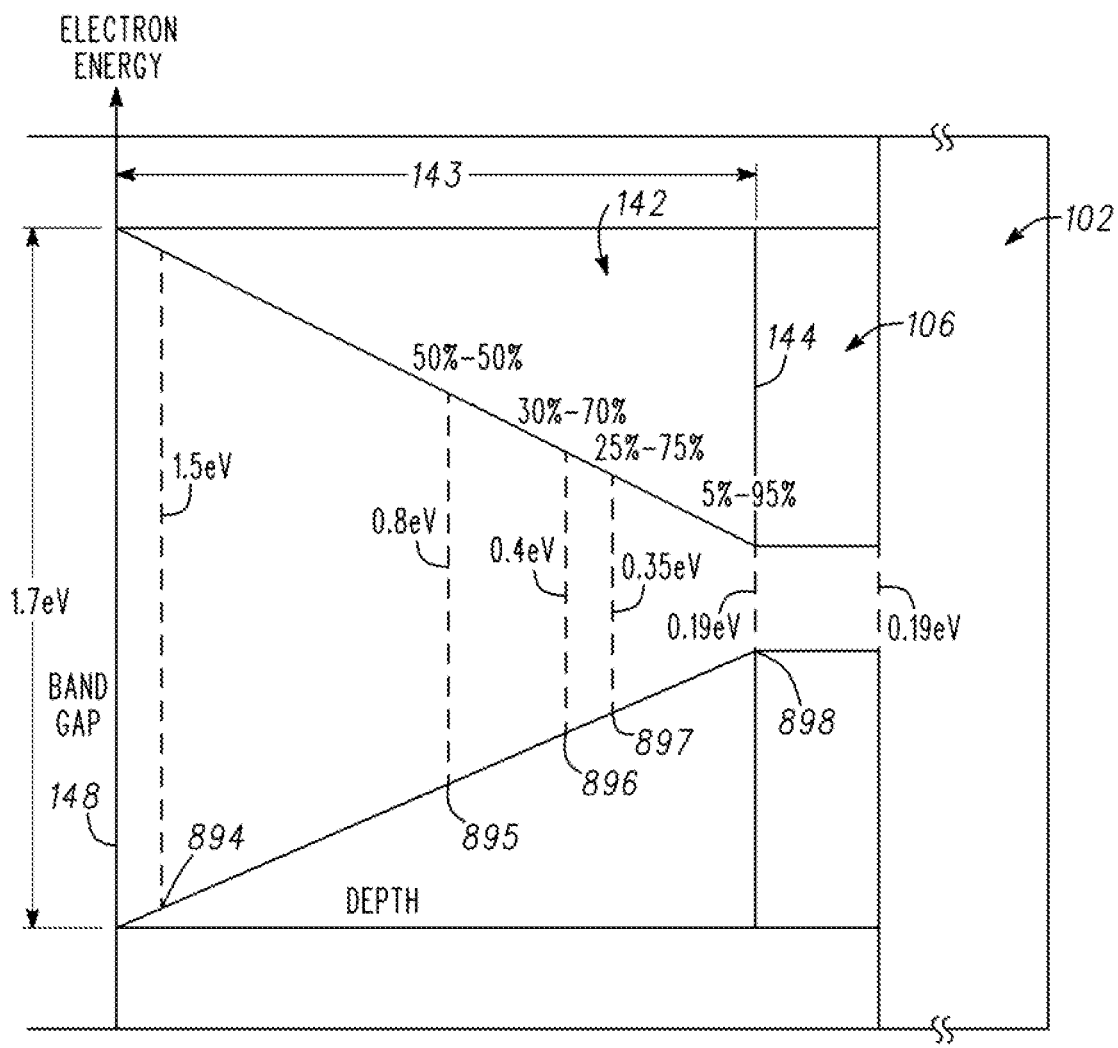
FIG. 8 is a greatly enlarged simplified diagrammatic illustration of a band gap diagram with simplified sectional view of the magnetically polarized photonic device.

FIG. 8 shows an energy versus depth diagram that identifies the graded band gap layer 142, annihilation layer 106, and substrate layer 102. In this diagram the annihilation layer 106 is a defect-filled layer of $Cd_{0.05}Hg_{0.95}Se$ with a band gap of approximately 0.19 eV that, for example only, can be deposited at a temperature that induces anti-site defects (Selenium atoms positioned where Mercury or Cadmium would be located in a perfect crystal). The graded band gap layer 142 in this diagram is grown in such a way that the material has superior quality and few defects. This can be accomplished, for example only, by increasing the temperature of growth to the ideal growth temperature for approximately perfect crystal growth without anti-site defects. The initial composition of the graded band gap is $Cd_{0.05}Hg_{0.95}Se$, indicated in FIG. 8 as dashed line 898 corresponding to dot 398 in FIG. 3. Furthermore, the composition of graded band gap layer 142 is continuously modified to include increasing amounts of CdSe compared to HgSe so that the band gap increases from approximately 0.19 eV to approximately 0.35 eV at $Cd_{0.25}Hg_{0.75}Se$ (dashed line 897 on FIG. 8 corresponding to dot 397 in FIG. 3). This growth continues with increasing CdSe content to $Cd_{0.3}Hg_{0.7}Se$ (dashed line 896 on FIG. 8 corresponding to dot 396 in FIG. 3) having a band gap of approximately 0.44 eV. This growth further continues with increasing CdSe content to $Cd_{0.5}Hg_{0.5}Se$ (dashed line 895 on FIG. 8 corresponding to dot 395 in FIG. 3) having a band gap of approximately 0.8 eV. This growth further continues with increasing CdSe content to $Cd_{0.9}Hg_{0.1}Se$ (dashed line 894 on FIG. 8 corresponding to dot 394 in FIG. 3) having a band gap of approximately 1.52 eV. This growth further continues with increasing CdSe content to approximately pure CdSe (dot 222 in FIG. 3) having a band gap of approximately 1.7 eV.

The foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above. For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components of any or all the claims.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted by those skilled in the art to specific environments, manufacturing specifications, design parameters or other operating requirements without departing from the general principles of the same.

I claim:

1. A magnetically polarized photonic device comprising:
   a substrate having a first surface and a second surface opposing the first surface, wherein the first surface and the second surface are substantially parallel to an x-y plane in a 3-dimensional coordinate system;
   an annihilation layer having a first thickness extending in a first direction parallel to a z-axis, a third surface, a fourth surface opposing the third surface, a fifth surface, a sixth surface, a seventh surface opposing the fifth surface, and an eighth surface opposing the sixth surface, wherein the third and fourth surfaces of the annihilation layer are substantially parallel to the x-y plane, and wherein the fifth and seventh surfaces of the annihilation layer are substantially parallel to an x-z plane, the x-z plane being orthogonal to the x-y plane, and wherein the sixth and eighth surfaces of the annihilation layer are substantially parallel to a y-z plane, the y-z plane being orthogonal to the x-y and x-z planes, and wherein the fifth, sixth, seventh and eighth surfaces are substantially perpendicular to the third and fourth surfaces and positioned there between, and wherein the fifth and seventh surfaces are substantially perpendicular to the sixth and eighth surfaces, and wherein the fourth surface of the annihilation layer is disposed on the first surface of the substrate;
   a graded band gap layer having a second thickness and a grading extending in the first direction parallel to the z-axis, and having a ninth surface, a tenth surface opposing the ninth surface, an eleventh surface, a twelfth surface, a thirteenth surface opposing the eleventh surface, and a fourteenth surface opposing the twelfth surface, wherein the ninth and tenth surfaces of the graded band gap layer are substantially parallel to the x-y plane and wherein the eleventh and thirteenth surfaces are substantially parallel to the x-z plane, and wherein the twelfth and fourteenth surfaces are substantially parallel to the y-z plane, and wherein the eleventh, twelfth, thirteenth, and fourteenth surfaces are substantially perpendicular to the ninth and tenth surfaces and positioned there between, and wherein the eleventh and thirteenth surfaces are substantially perpendicular to the twelfth and fourteenth surfaces and positioned there between, and wherein the tenth surface of the graded band gap layer is disposed on the third surface of the annihilation layer thereby stacking the graded band gap layer and the annihilation layer in the first direction parallel to the z-axis, wherein free electrons and free holes that are generated when a plurality of photons strike the graded band gap layer both flow in the direction of the grading toward the annihilation layer;
   a first contact having a third thickness with a direction of thickness extending in a second direction parallel to a y-axis, and having a fifteenth surface and a sixteenth surface substantially orthogonal to the direction of thickness, the fifteenth and sixteenth surfaces are substantially parallel to the x-z plane and substantially orthogonal to the ninth and tenth surface of the graded band gap layer, the fifteenth surface of the first contact being directly and electrically coupled to at least a portion of the fifth surface of the annihilation layer;
   a second contact having a fourth thickness with a direction of thickness extending in the second direction parallel to the y-axis, and having a seventeenth surface and an eighteenth surface substantially orthogonal to the direction of thickness, the seventeenth and eighteenth surfaces are substantially parallel to the x-z plane and substantially orthogonal to the ninth and tenth surface of the graded band gap layer, the eighteenth surface of the second contact being directly and electrically coupled to at least a portion of the seventh surface of the annihilation layer;
   wherein the annihilation layer comprising a layer of material configured to collect and recombine the free electrons and free holes that are generated when a plurality of photons strike the graded band gap layer; and
   wherein when a magnetic field with field lines extending in a third direction parallel to an x-axis and substantially orthogonal to the direction of grading in the graded band gap layer is applied to the graded band gap layer and the annihilation layer, current flows between the first and second contacts in the second direction parallel to the y-axis and substantially orthogonal to the magnetic field lines and the direction of grading in the graded band gap layer.

2. The magnetically polarized photonic device as claimed in claim 1 wherein the substrate is made from a semiconductor material.

3. The magnetically polarized photonic device as claimed in 1 wherein the substrate is made of an insulative material.

4. The magnetically polarized photonic device as claimed in claim 1 wherein the annihilation layer is made from a group comprising:
   Mercury Cadmium Telluride (HgCdTe), Mercury Cadmium Selenide (HgCdSe), Mercury Telluride (HgTe), Indium Antimonide (InSb), Cadmium Telluride (CdTe), Mercury Selenide (HgSe), Indium Arsenide (InAs), Aluminum Gallium Antimonide (AlGaSb), Indium Arsenide Antimonide (InAsSb), Mercury Cadmium Selenide (HgCdSe), Cadmium Zinc Selenide Telluride (CdZnSeTe), and Cadmium Manganese Telluride (CdMnTe), Zinc Gallium Antimonide Telluride (ZnGaSbTe), Zinc Aluminum Antimonide Telluride (ZnAlSbTe), Gallium Antimonide (GaSb), Zinc Telluride (ZnTe), Aluminum Antimonide (AISb), Manganese Telluride (MnTe), Gallium Arsenide (GaAs), and combinations and mixtures thereof.

5. The magnetically polarized photonic device as claimed in claim 1 wherein the graded band gap layer is made from a group comprising:

Mercury Cadmium Telluride (HgCdTe), Mercury Cadmium Selenide (HgCdSe), Mercury Telluride (HgTe), Indium Antimonide (InSb), Cadmium Telluride (CdTe), Mercury Selenide (HgSe), Indium Arsenide (InAs), Aluminum Gallium Antimonide (AIGaSb), Indium Arsenide Antimonide (InAsSb), Mercury Cadmium Selenide (HgCdSe), Cadmium Zinc Selenide Telluride (CdZnSeTe), and Cadmium Manganese Telluride (CdMnTe), Zinc Gallium Antimonide Telluride (ZnGaSbTe), Zinc Aluminum Antimonide Telluride (ZnAISbTe), Gallium Antimonide (GaSb), Zinc Telluride (ZnTe), Aluminum Antimonide (AISb), Manganese Telluride (MnTe), Gallium Arsenide (GaAs), and combinations and mixtures thereof.

6. The magnetically polarized photonic device as claimed in claim 1 wherein the annihilation layer has band gap values ranging from 8.0 eV to 0.0 eV.

7. The magnetically polarized photonic device as claimed in claim 1 wherein the graded band gap layer has band gap values ranging from 8.0 eV to 0.0 eV.

8. The magnetically polarized photonic device as claimed in claim 1 wherein the annihilation layer is made having a graded band gap.

9. The magnetically polarized photonic device as claimed in claim 1 wherein the annihilation layer includes defects.

10. The magnetically polarized photonic device as claimed in claim 8 further including defects.

11. The magnetically polarize photonic device as claimed in claim 1 further including a cover layer disposed over the graded band gap layer.

12. The magnetically polarized photonic device as claimed in claim 11 wherein the cover layer disposed over the graded band gap layer is a filter of wavelengths of light.

13. The magnetically polarized photonic device as claimed in claim 11 wherein the cover layer disposed over the graded band gap layer is a protective coating.

14. The magnetically polarized photonic device as claimed in claim 11 wherein the cover layer disposed over the graded band gap layer is a lens.

15. The magnetically polarized photonic device as claimed in claim 1 wherein the sixteenth surface of the first contact is electrically coupled to the fifth surface of the graded band gap layer.

16. The magnetically polarized photonic device as claimed in claim 15 wherein the sixteenth surface of the first contact is disposed on the fifth surface of the graded band gap layer.

17. The magnetically polarized photonic device as claimed in claim 1 wherein the seventeenth surface of the second contact is electrically coupled to seventh surface of the graded band gap layer.

18. The magnetically polarized photonic device as claimed in claim 17 wherein the seventeenth surface of the second contact is disposed on the seventh surface of the graded band gap layer.

19. The magnetically polarized photonic device as claimed in claim 7 wherein the graded band gap layer having a first portion and a second portion, the first portion arranged with the largest band gap value disposed about the ninth surface with a decrease of band gap values to the second portion, the second portion arranged with the smallest band gap value at the tenth surface of the graded band gap layer with a decrease of band gap values from the first portion, wherein the percentage decrease in band gap values is greater in the second portion than in the first portion.

20. The magnetically polarized photonic device as claimed in claim 1 wherein the graded band gap layer includes a thickness, the thickness ranging from 0.1 microns to 50.0 microns.

21. The magnetically polarized photonic device as claimed in claim 20 wherein the thickness of the graded band gap layer has a thickness from 5.0 microns to 30.0 microns.

22. The magnetically polarized photonic device as claimed in claim 21 wherein the thickness of the graded band gap layer has a thickness from 10.0 microns to 20.0 microns.

23. The magnetically polarized photonic device as claimed in claim 1 further comprising:
a magnetic field having a plurality of magnetic field lines, where at least one magnetic field line enters through the twelfth surface of the graded band gap layer.

24. The magnetically polarized photonic device as claimed in claim 23 wherein at least one magnetic field line exits through the fourteenth surface of the graded band gap layer.

25. The magnetically polarized photonic device as claimed in claim 23 wherein at least one magnetic field line enters through the sixth surface of the annihilation layer.

26. The magnetically polarized photonic device as claimed in claim 23 wherein at least one magnetic field line exits through the eighth surface of the annihilation layer.

27. The magnetically polarized photonic device as claimed in claim 23 wherein the magnetic field ranges from 0.1 Tesla to 50.0 Tesla.

28. The magnetically polarized photonic device as claimed in claim 27 wherein the magnetic field ranges from 0.5 Tesla to 10.0 Tesla.

29. A magnetically polarized photonic device comprising:
a substrate having a first surface and a second surface opposing the first surface, wherein the first surface and the second surface are substantially parallel to an x-y plane in a 3-dimensional coordinate system;
a graded band gap layer having a first thickness and a grading extending in a first direction parallel to a z-axis, a third surface, a fourth surface opposing the third surface, a fifth surface, a sixth surface, a seventh surface opposing the fifth surface, and an eighth surface opposing the sixth surface, wherein the third and fourth surfaces of the graded band gap layer are substantially parallel to the x-y plane, and wherein the fifth and seventh surfaces of the graded band gap layer are substantially parallel to an x-z plane, the x-z plane being orthogonal to the x-y plane, and wherein the sixth and eighth surfaces of the graded band gap layer are substantially parallel to a y-z plane, the y-z plane being orthogonal to the x-y and x-z planes, and wherein the fifth, sixth, seventh and eighth surfaces are substantially perpendicular to the third and fourth surfaces and positioned therebetween, and wherein the fifth and seventh surfaces are substantially perpendicular to the sixth and eighth surfaces, and wherein the fourth surface of the graded band gap layer is disposed on the first surface of the substrate;
an annihilation layer comprising a layer of material configured to collect and recombine free electrons and free holes that are generated when a plurality of photons strike the graded band gap layer, the annihilation layer having a second thickness extending in the first direction parallel to the z-axis, and having a ninth surface, a tenth surface, an eleventh surface, a twelfth surface, a thirteenth surface opposing the eleventh surface, and a fourteenth surface opposing the twelfth surface, wherein the ninth and tenth surfaces of the annihilation layer are substantially parallel to the x-y plane and wherein the eleventh and thirteenth surfaces are substantially parallel to the x-z plane, and wherein the twelfth and fourteenth surfaces are substantially parallel to the y-z plane, and wherein the eleventh, twelfth, thirteenth, and fourteenth surfaces are substantially perpendicular to the ninth and tenth surfaces and positioned therebetween, and wherein the eleventh and thirteenth surfaces are substantially perpendicular to the twelfth and fourteenth surfaces and positioned therebetween, and wherein the tenth surface of the annihilation layer is disposed on the third surface of the graded band gap layer thereby stacking the graded band gap layer and the annihilation layer in the first direction parallel to the z-axis, wherein free electrons and free holes that are generated when a plurality of photons strike the graded band gap layer both flow in the direction of the grading toward the annihilation layer;
a first contact having a third thickness extending in a second direction parallel to a y-axis, and having a fifteenth surface and a sixteenth surface substantially orthogonal to the direction of thickness, the fifteenth and sixteenth surfaces are substantially parallel to the x-z plane and substantially orthogonal to the third and fourth surface of the graded band gap layer, the fifteenth surface of the first contact being directly and electrically coupled to at least a portion of the fifth surface of the graded band gap layer;
a second contact having a fourth thickness with a direction of thickness extending in the second direction parallel to the y-axis, and having a seventeenth surface and an eighteenth surface substantially orthogonal to the direction of thickness, the seventeenth and eighteenth surfaces are substantially parallel to the x-z plane and substantially orthogonal to the third and fourth surface of the graded band gap layer, the eighteenth surface of the second contact being directly and electrically coupled to at least a portion of the seventh surface of the graded band gap layer;
wherein when a magnetic field with field lines extending in a third direction parallel to an x-axis and substantially orthogonal to the direction of grading in the graded band gap layer is applied to the annihilation layer and the graded band gap layer, current flows between the first and second contacts in the second direction parallel to the y-axis and substantially orthogonal to the magnetic field lines and the direction of grading in the graded band gap layer.

30. The magnetically polarized photonic device as claimed in claim 29 wherein the substrate is made from a semiconductor material.

31. The magnetically polarized photonic device as claimed in 29 wherein the substrate is made of an insulative material.

32. The magnetically polarized photonic device as claimed in claim 29 wherein the graded band gap layer is made from a group comprising:
Mercury Cadmium Telluride (HgCdTe), Mercury Cadmium Selenide (HgCdSe), Mercury Telluride (HgTe), Indium Antimonide (InSb), Cadmium Telluride (CdTe), Mercury Selenide (HgSe), Indium Arsenide (IlnAs), Aluminum Gallium Antimonide (AlGaSb), Indium Arsenide Antimonide (InAsSb), Mercury Cadmium Selenide (HgCdSe), Cadmium Zinc Selenide Telluride (CdZnSeTe), and Cadmium Manganese Telluride (CdMnTe), Zinc Gallium Antimonide Telluride (ZnGaSbTe), Zinc Aluminum Antimonide Telluride (ZnAlSbTe), Gallium Antimonide (GaSb), Zinc Telluride (ZnTe), Aluminum Antimonide (AlSb), Manganese Telluride (MnTe), Gallium Arsenide (GaAs), and combinations and mixtures thereof.

33. The magnetically polarized photonic device as claimed in claim 29 wherein the annihilation layer is made from a group comprising:
Mercury Cadmium Telluride (HgCdTe), Mercury Cadmium Selenide (HgCdSe), Mercury Telluride (HgTe), Indium Antimonide (InSb), Cadmium Telluride (CdTe), Mercury Selenide (HgSe), Indium Arsenide (InAs), Aluminum Gallium Antimonide (AlGaSb), Indium Arsenide Antimonide (InAsSb), Mercury Cadmium Selenide (HgCdSe), Cadmium Zinc Selenide Telluride (CdZnSeTe), and Cadmium Manganese Telluride (CdMnTe), Zinc Gallium Antimonide Telluride (ZnGaSbTe), Zinc Aluminum Antimonide Telluride (ZnAlSbTe), Gallium Antimonide (GaSb), Zinc Telluride (ZnTe), Aluminum Antimonide (AlSb), Manganese Telluride (MnTe), Gallium Arsenide (GaAs), and combinations and mixtures thereof.

34. The magnetically polarize photonic device as claimed in claim 29 further including a layer disposed over the substrate.

35. The magnetically polarized photonic device as claimed in claim 29 further comprising:
a magnetic field having a plurality of magnetic field lines, where at least one magnetic field line enters through the twelfth surface of the annihilation layer.

36. The magnetically polarized photonic device as claimed in claim 35 wherein at least one magnetic field line exits through the fourteenth surface of the annihilation layer.

37. The magnetically polarized photonic device as claimed in claim 34 wherein at least one magnetic field line enters through the sixth surface of the graded band gap layer.

38. A magnetically polarized photonic device comprising:
a substrate having a first surface and a second surface opposing the first surface, wherein the first surface and the second surface are substantially parallel to an x-y plane in a 3-dimensional coordinate system;
an annihilation layer disposed on the second surface of the substrate, the annihilation layer comprising a layer of material configured to collect and recombine free electrons and free holes that are generated when a plurality of photons strike a graded band gap layer, the annihilation layer having a first thickness being defined by a first and a second sidewall, wherein free electrons and free holes that are generated when a plurality of photons strike the graded band gap layer both flow in the direction of the grading toward the annihilation layer, wherein the first and second sidewall are orthogonal to the second surface of the substrate;
the graded band gap layer disposed on the annihilation layer parallel the substrate, the graded band gap layer having a grading extending in a first direction parallel to a z-axis and a second thickness being defined by a third and a fourth sidewall, wherein the third and fourth sidewalls are orthogonal to the second surface of the substrate;

a first contact being directly and electrically coupled to at least a portion of the first sidewall of the annihilation layer and the third sidewall of the graded band gap layer; and a second contact being directly and electrically coupled to at least a portion of the second sidewall of the annihilation layer and the fourth sidewall of the graded band gap layer;

wherein when a magnetic field with field lines extending in a third direction parallel to an x-axis and substantially orthogonal to the direction of grading in the graded band gap layer is applied to the annihilation layer and the graded band gap layer, current flows between the first and second contacts in the second direction parallel to the y-axis and substantially orthogonal to the magnetic field lines and the direction of grading in the graded band gap layer.

* * * * *